(12) United States Patent
Zhang

(10) Patent No.: US 11,594,699 B2
(45) Date of Patent: Feb. 28, 2023

(54) DISPLAY SUBSTRATE AND METHOD OF MANUFACTURING THE SAME, AND DISPLAY APPARATUS

(71) Applicant: BOE TECHNOLOGY GROUP CO., LTD., Beijing (CN)

(72) Inventor: Zhenqi Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 125 days.

(21) Appl. No.: 17/264,403

(22) PCT Filed: Jun. 15, 2020

(86) PCT No.: PCT/CN2020/096198
§ 371 (c)(1),
(2) Date: Jan. 29, 2021

(87) PCT Pub. No.: WO2020/253656
PCT Pub. Date: Dec. 24, 2020

(65) Prior Publication Data
US 2021/0313533 A1    Oct. 7, 2021

(30) Foreign Application Priority Data
Jun. 18, 2019 (CN) .......................... 201910526174.4

(51) Int. Cl.
*H01L 51/50* (2006.01)
*H01L 51/00* (2006.01)
*H01L 51/56* (2006.01)

(52) U.S. Cl.
CPC ........ *H01L 51/502* (2013.01); *H01L 51/0006* (2013.01); *H01L 51/5056* (2013.01);
(Continued)

(58) Field of Classification Search
CPC .......................... H01L 51/502; H01L 51/0006
See application file for complete search history.

(56) References Cited

U.S. PATENT DOCUMENTS

| | | |
|---|---|---|
| 6,602,395 B1 | 8/2003 | Zhuang et al. |
| 2013/0020113 A1 | 1/2013 | Corbea et al. |
| 2019/0379007 A1 | 12/2019 | Ma et al. |

FOREIGN PATENT DOCUMENTS

| | | |
|---|---|---|
| CN | 106206965 A | 12/2016 |
| CN | 106340533 A | 1/2017 |

(Continued)

OTHER PUBLICATIONS

PCT International Search Report (w/English translation) for corresponding PCT Application No. PCT/CN2020/096198, dated Sep. 17, 2020, 8 pages.

(Continued)

*Primary Examiner* — Anthony Ho
(74) *Attorney, Agent, or Firm* — Dority & Manning, P.A.

(57) ABSTRACT

A display substrate includes: a backplane; a first electrode layer disposed on a side of the backplane; and a light-emitting layer disposed on a side of the first electrode layer away from the backplane. The light-emitting layer includes nanoparticles and a product that is obtained by an electrochemical reaction of electrochemically active groups contained in first organic ligands coordinated to the nanoparticles. The nanoparticles are cross-linked together through the product.

16 Claims, 11 Drawing Sheets

---

S11: Nanoparticles coordinated with a first organic ligand are prepared. The first organic ligand contains electrochemical active group(s) capable of undergoing an electrochemical reaction S12: An electrochemical reaction occurs between first organic ligands coordinated to nanoparticles, so that the nanoparticles are cross-linked to form the nanoparticle film on a surface of an energized working electrode

(52) U.S. Cl.
CPC ...... *H01L 51/5072* (2013.01); *H01L 51/5092* (2013.01); *H01L 51/56* (2013.01)

(56) References Cited

FOREIGN PATENT DOCUMENTS

| | | |
|---|---|---|
| CN | 106374056 A | 2/2017 |
| CN | 108276986 A | 7/2018 |
| CN | 109020851 A | 12/2018 |
| CN | 110265585 A | 9/2019 |

OTHER PUBLICATIONS

Chinese First Office Action (w/ English translation) for corresponding CN Application No. 201910526174.4, 20 pages.
Chinese Second Office Action (w/ English translation) for corresponding CN Application No. 201910526174.4, 20 pages.

S231 — The first sub-electrodes are energized, the method of manufacturing the nanoparticle film described in the above embodiments is adopted, and a material for forming the first light-emitting portions is used, so as to form the first light-emitting portions on sides of the first sub-electrodes away from the backplane S232 — The second sub-electrodes are energized, the method of manufacturing the nanoparticle film described in the above embodiments is adopted, and a material for forming the second light-emitting portions is used, so as to form the second light-emitting portions on sides of the second sub-electrodes away from the backplane S233 — The third sub-electrodes are energized, the method of manufacturing the nanoparticle film described in the above embodiments is adopted, and a material for forming the third light-emitting portions is used, so as to form the third light-emitting portions on sides of the third sub-electrodes away from the backplane

FIG. 11

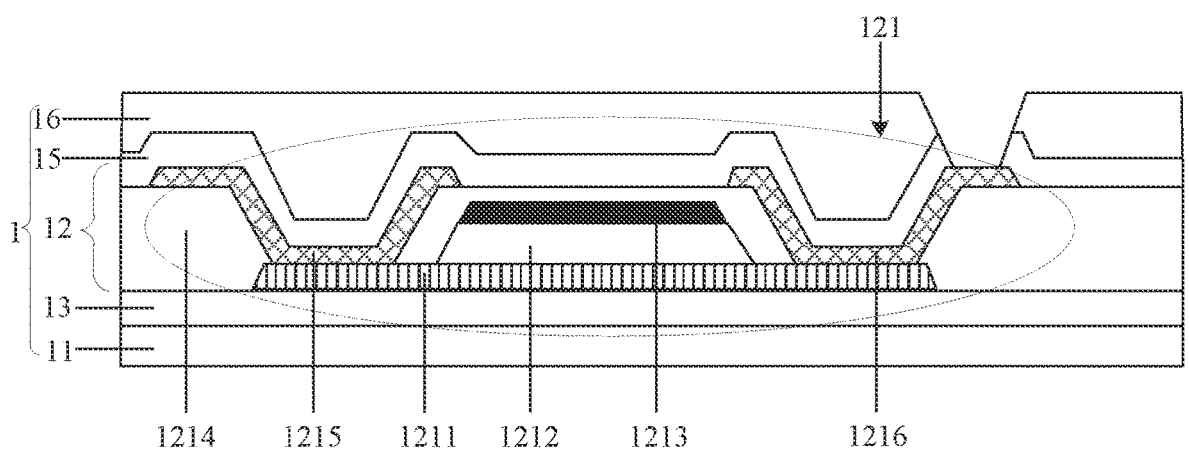

FIG. 12

DISPLAY SUBSTRATE AND METHOD OF MANUFACTURING THE SAME, AND DISPLAY APPARATUS

CROSS-REFERENCE TO RELATED APPLICATIONS

This application is a national phase entry under 35 USC 371 of International Patent Application No. PCT/CN2020/096198 filed on Jun. 15, 2020, which claims priority to Chinese Patent Application No. 201910526174.4, filed on Jun. 18, 2019, which are incorporated herein by reference in their entirety.

TECHNICAL FIELD

The present disclosure relates to the field of display technologies, and in particular, to a display substrate, a method of manufacturing the display substrate, and a display apparatus.

BACKGROUND

In electroluminescent devices, a quantum dot material used in a quantum dot light-emitting diode (QLED) has a narrower emission spectrum, better stability and lower synthesis cost than an organic material used in an organic light-emitting diode (OLED). Methods of forming a film in the QLED mainly include printing, transfer, and photolithography.

SUMMARY

In one aspect, a display substrate is provided. The display substrate includes a backplane, a first electrode layer, and a light-emitting layer. The first electrode layer is disposed on a side of the backplane. The light-emitting layer is disposed on a side of the first electrode layer away from the backplane. The light-emitting layer includes nanoparticles and a product that is obtained by an electrochemical reaction of electrochemically active groups contained in first organic ligands coordinated to the nanoparticles, and the nanoparticles are cross-linked together through the product.

In some embodiments, the first organic ligands include at least one of a thiophene derivative, a pyrrole derivative, a furan derivative, an aniline derivative, and a diphenyl ether derivative.

In some embodiments, the light-emitting layer includes first light-emitting portions capable of emitting light of a first color, second light-emitting portions capable of emitting light of a second color, and third light-emitting portions capable of emitting light of a third color. The first color, the second color and the third color are three primary colors. The first electrode layer includes first sub-electrodes located on sides of the first light-emitting portions proximate to the backplane, second sub-electrodes located on sides of the second light-emitting portions proximate to the backplane, and third sub-electrodes located on sides of the third light-emitting portions proximate to the backplane.

In some embodiments, the nanoparticles are quantum dots.

In some embodiments, the display substrate further includes a second electrode layer disposed on a side of the light-emitting layer away from the backplane; a hole injection layer and/or a hole transport layer disposed between the first electrode layer and the light-emitting layer; and an electron injection layer and/or an electron transport layer disposed between the second electrode layer and the light-emitting layer.

In another aspect, a method of manufacturing a display substrate is provided. The method includes: manufacturing a backplane; forming a first electrode layer on a side of the backplane; and forming a light-emitting layer on a side of the first electrode layer away from the backplane. The light-emitting layer includes nanoparticles and a product that is obtained by an electrochemical reaction of electrochemically active groups contained in first organic ligands coordinated to the nanoparticles, and the nanoparticles are cross-linked together through the product.

In some embodiments, forming the light-emitting layer on the side of the first electrode layer away from the backplane includes: preparing the nanoparticles coordinated with the first organic ligands, the first organic ligands containing the electrochemically active groups capable of undergoing the electrochemical reaction; and energizing the first electrode layer to cause the electrochemical reaction of the first organic ligands coordinated to the nanoparticles, so that the nanoparticles are cross-linked to form a nanoparticle film on a surface of the first electrode layer, the nanoparticle film being the light-emitting layer.

In some embodiments, preparing the nanoparticles coordinated with the first organic ligands includes: obtaining the nanoparticles coordinated with the first organic ligands through a coordination reaction between the nanoparticles and the first organic ligands; or obtaining the nanoparticles coordinated with the first organic ligands through a ligand exchange reaction between nanoparticles coordinated with second organic ligands and the first organic ligands. In some embodiments, preparing the nanoparticles coordinated with the first organic ligands further includes: preparing the first organic ligands. Preparing the first organic ligands includes: providing an organic material having the electrochemically active groups; and using a coordination group as a substituent to substitute for at least one hydrogen atom in the organic material to obtain the first organic ligands. In some embodiments, the organic material having the electrochemically active groups includes at least one of thiophene, pyrrole, furan, aniline, and diphenyl ether.

In some embodiments, in a case where the nanoparticles coordinated with the first organic ligands are obtained through the ligand exchange reaction between the nanoparticles coordinated with the second organic ligands and the first organic ligands, the second organic ligands include at least one of oleic acid, oleylamine, dodecyl mercaptan, octyl mercaptan, trioctyl phosphine, trioctyl phosphine oxide, and ethanolamine.

In some embodiments, energizing the first electrode layer to cause the electrochemical reaction of the first organic ligands coordinated to the nanoparticles, so that the nanoparticles are cross-linked to form the nanoparticle film on the surface of the first electrode layer, the nanoparticle film being the light-emitting layer, includes: preparing an electrolyte solution containing the nanoparticles coordinated with the first organic ligands; immersing the backplane on which the first electrode layer has been formed in the electrolyte solution; and energizing the first electrode layer, so that electrolysis is used to cause the electrochemical reaction of the first organic ligands coordinated to the nanoparticles, and the nanoparticles are cross-linked to form the nanoparticle film on the surface of the first electrode layer, the nanoparticle film being the light-emitting layer.

In some embodiments, in a case where the light-emitting layer includes first light-emitting portions capable of emitting light of a first color, second light-emitting portions capable of emitting light of a second color and third light-emitting portions capable of emitting light of a third color, and the first electrode layer includes first sub-electrodes located on sides of the first light-emitting portions proximate to the backplane, second sub-electrodes located on sides of the second light-emitting portions proximate to the backplane and third sub-electrodes located on sides of the third light-emitting portions proximate to the backplane, a step of forming the light-emitting layer includes:

preparing an electrolyte solution containing first nanoparticles coordinated with the first organic ligands, the first nanoparticles being used for forming the first light-emitting portions; immersing the backplane on which the first electrode layer has been formed in the electrolyte solution; and energizing the first sub-electrodes in the first electrode layer, so that electrolysis is used to cause the electrochemical reaction of the first organic ligands coordinated to the first nanoparticles, and the first nanoparticles are cross-linked to form first nanoparticle films on surfaces of the first sub-electrodes, the first nanoparticle films being the first light-emitting portions;

preparing an electrolyte solution containing second nanoparticles coordinated with the first organic ligands, the second nanoparticles being used for forming the second light-emitting portions; immersing the backplane on which the first electrode layer has been formed in the electrolyte solution; and energizing the second sub-electrodes in the first electrode layer, so that electrolysis is used to cause the electrochemical reaction of the first organic ligands coordinated to the second nanoparticles, and the second nanoparticles are cross-linked to form second nanoparticle films on surfaces of the second sub-electrodes, the second nanoparticle films being the second light-emitting portions; and preparing an electrolyte solution containing third nanoparticles coordinated with the first organic ligands, the third nanoparticles being used for forming the third light-emitting portions; immersing the backplane on which the first electrode layer has been formed in the electrolyte solution; and energizing the third sub-electrodes in the first electrode layer, so that electrolysis is used to cause the electrochemical reaction of the first organic ligands coordinated to the third nanoparticles, and the third nanoparticles are cross-linked to form third nanoparticle films on surfaces of the third sub-electrodes, the third nanoparticle films being the third light-emitting portions.

In some embodiments, the electrochemical reaction is realized by any one of a cyclic voltammetry method, a constant potential method, a constant current method and a pulse polarization method.

In some embodiments, the method further includes: forming a second electrode layer on a side of the light-emitting layer away from the backplane.

In yet another aspect, a display apparatus is provided. The display apparatus includes the display substrate as described in the above embodiments, and an encapsulation structure disposed on the display substrate.

BRIEF DESCRIPTION OF THE DRAWINGS

In order to describe technical solutions in the present disclosure more clearly, the accompanying drawings to be used in the description of some embodiments of the present disclosure will be introduced briefly. Obviously, the accompanying drawings to be described below are merely accompanying drawings of some embodiments of the present disclosure, and those of ordinary skill in the art can obtain other drawings according to those drawings. In addition, the accompanying drawings to be described below may be regarded as schematic diagrams, and are not limitations on an actual size of a product, an actual process of a method and an actual timing of a signal involved in the embodiments of the present disclosure.

FIG. 11 is a flowchart of manufacturing a light-emitting layer in a method of manufacturing a display substrate, in accordance with some embodiments;

FIGS. 12 to 17 are diagrams showing steps in a method of manufacturing a display substrate, in accordance with some embodiments;

DETAILED DESCRIPTION

Figure 1:
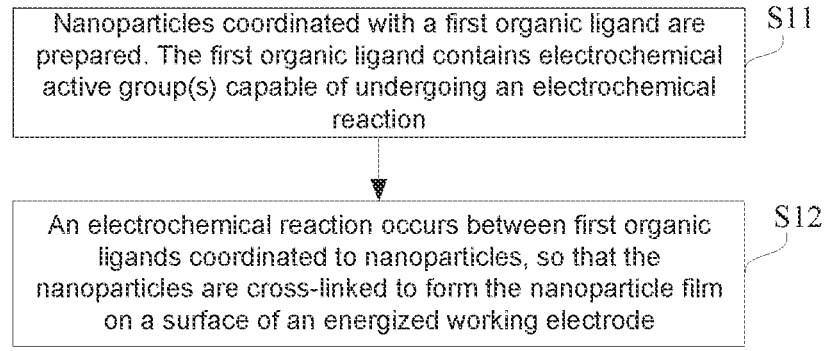
FIG. 1 is a flowchart of a method of manufacturing a nanoparticle film, in accordance with some embodiments.

Technical solutions in embodiments of the present disclosure will be described clearly and completely with reference to the drawings below. Obviously, the described embodiments are merely some but not all of embodiments of the present disclosure. All other embodiments obtained by a person of ordinary skill in the art on a basis of the embodiments of the present disclosure shall be included in the protection scope of the present disclosure.

Unless the context requires otherwise, term "comprise" and other forms thereof such as the third-person singular form "comprises" and the present participle form "comprising" throughout the description and the claims are construed as an open and inclusive meaning, i.e., "including, but not limited to". In the description, the terms such as "one embodiment", "some embodiments", "exemplary embodiments", "example", "specific example", or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, specific features, structures, materials or characteristics may be included in any one or more embodiments or examples in any suitable manner.

Terms such as "first" and "second" are used for descriptive purposes only, and are not to be construed as indicating or implying the relative importance or implicitly indicating the number of indicated technical features below. Thus, features defined with "first" or "second" may explicitly or implicitly include one or more of the features.

The expression "at least one of A, B, and C" has a same meaning as the expression "at least one of A, B, or C", and both include the following combinations of A, B, and C: only A, only B, only C, a combination of A and B, a combination of A and C, a combination of B and C, and a combination of A, B, and C.

The phrase "A and/or B" includes the following three combinations: only A, only B, and a combination of A and B.

The phrase "applicable to" or "configured to" used herein has an open and inclusive meaning, which does not exclude devices that are applicable to or configured to perform additional tasks or steps.

Exemplary embodiments are described herein with reference to sectional views and/or plan views as idealized exemplary drawings. In the drawings, sizes of regions and thicknesses of layers are exaggerated for clarity. Variations in shape relative to the drawings due to, for example, manufacturing techniques and/or tolerances may be envisaged. Therefore, the exemplary embodiments should not be construed as being limited to the shapes of regions shown herein, but include deviations in shape due to, for example, manufacturing. For example, an etching region shown as a rectangle usually has the feature of being curved. Therefore, regions shown in the drawings are schematic in nature, and their shapes are not intended to show actual shapes of the regions in a device and are not intended to limit the scope of the exemplary embodiments.

In the description of the present disclosure, "a/the plurality of" means two or more unless otherwise specified.

Some embodiments of the present disclosure provide a method of manufacturing a nanoparticle film. Referring to FIG. 1, the method includes steps 11 and 12 (S11~S12).

In S11, nanoparticles coordinated with a first organic ligand are prepared. The first organic ligand contains electrochemical active group(s) capable of undergoing an electrochemical reaction.

The nanoparticles may be any nanoparticle material of a thin film that needs to be formed. For example, the nanoparticles may be quantum dots, and a material of the quantum dots may include at least one of a silicon material, a germanium material, a cadmium sulfide material, a cadmium selenide material, a cadmium telluride material, a zinc selenide material, a lead sulfide material, a lead selenide material, an indium phosphide material and an indium arsenide material.

The nanoparticles may be core-shell nanocomposite particles. The term "core-shell" means that the nanoparticle includes an outer shell and an inner core encapsulated by the outer shell, and the outer shell and the inner core may both be made of an inorganic material. For example, the nanoparticles are CdSe/ZnS nanocomposite particles, in which CdSe (cadmium selenide) is the inner core and ZnS (zinc sulfide) is the outer shell.

In S11, i.e., in the process of preparing the nanoparticles coordinated with the first organic ligand, the first organic ligand needs to be prepared first.

Figure 4:
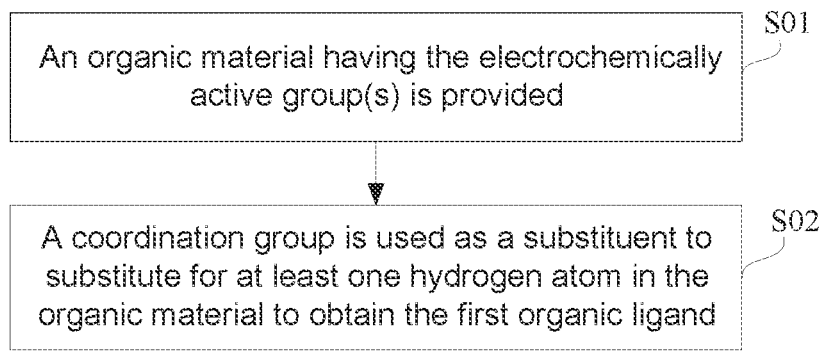
FIG. 4 is a flowchart of manufacturing a first organic ligand in a method of manufacturing a nanoparticle film, in accordance with some embodiments.

As shown in FIG. 4, the step of preparing the first organic ligand includes steps 01 and 02 (S01~S02).

In S01, an organic material having electrochemically active group(s) is provided.

For example, the organic material having the electrochemically active group(s) includes at least one of thiophene, pyrrole, furan, aniline, and diphenyl ether.

The organic material having the electrochemically active group(s) include multiple sites, and the sites are occupied by hydrogen atoms. Some of these sites serve as active sites in the subsequent step of electrochemical reaction, and at least one of the hydrogen atoms at other sites is substituted by a substituent in the subsequent step of forming the first organic ligand. In a case where the substituent is a coordination group, at least one hydrogen atom at the sites is substituted, so that the organic material having the electrochemically active group(s) becomes a ligand.

With thiophene as an example, the chemical formula of thiophene is $C_4H_4S$, and thiophene is a five-membered heterocyclic compound containing a heteroatom of sulfur. In thiophene, four carbon atoms and one sulfur atom form a ring, and four hydrogen atoms are connected to the carbon atoms by chemical bonds; two hydrogen atoms closer to the sulfur atom are usually electrochemical active sites, and two hydrogen atoms farther away from the sulfur atom will be substituted by substituents under certain conditions.

In S02, a coordination group is used as a substituent to substitute for at least one hydrogen atom in the organic material to obtain the first organic ligand.

For example, the coordination group includes at least one of amino, hydroxyl, carboxyl, a mercapto group, thioether, phosphine, phosphine oxide.

In S02, one or more hydrogen atoms in the organic material having the electrochemically active group(s) are substituted by substituents (i.e., coordination groups) to form the first organic ligand.

In S01 and S02, the organic material having the electrochemically active group(s) (that is, the organic material that has not yet become the ligand) may include at least one of thiophene, pyrrole, furan, aniline, and diphenyl ether. In this case, after the coordination group is used as a substituent to substitute for the hydrogen atom in the organic material, the first organic ligand is formed, and a material of the formed first organic ligand includes at least one of a thiophene derivative, a pyrrole derivative, a furan derivative, an aniline derivative and a diphenyl ether derivative.

For example, the chemical structural formulas of several first organic ligands are as follows.

Herein, one or more of $R_1$, $R_2$, $R_3$ . . . etc., in the first organic ligand represent the coordination groups, and one or more of $X_1$ and $Y_1$ in the first organic ligand represent the hydrogen atoms at the electrochemically active sites.

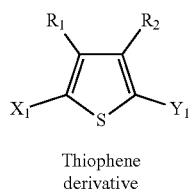

Thiophene derivative

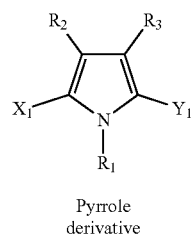

Pyrrole derivative

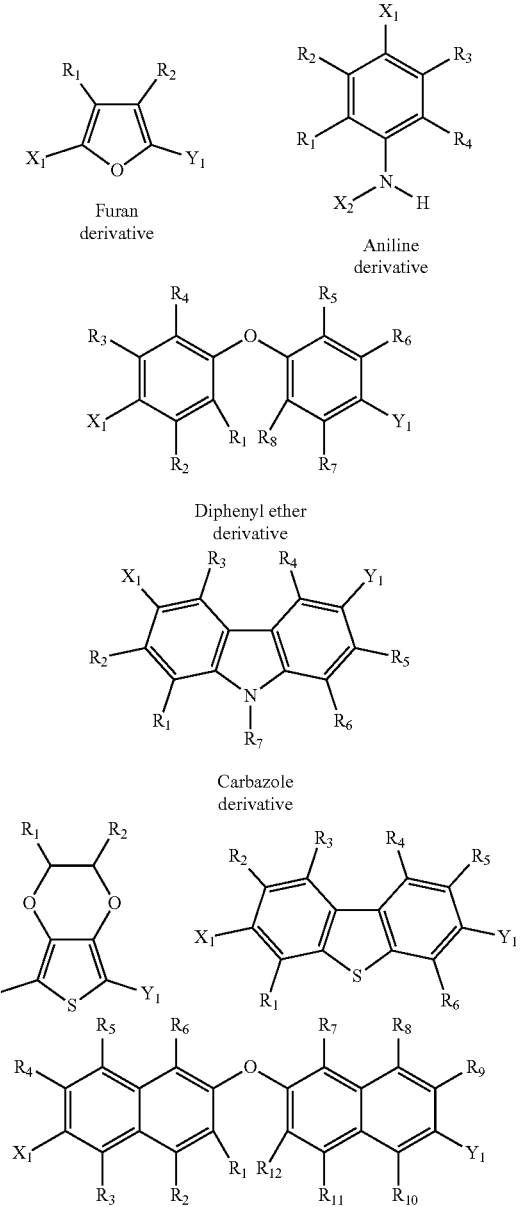

Furan derivative

Aniline derivative

Diphenyl ether derivative

Carbazole derivative

In S11, after the first organic ligand is prepared, there are many ways to form the nanoparticles coordinated with the first organic ligand by using nanoparticles and the prepared first organic ligand.

Figure 2:
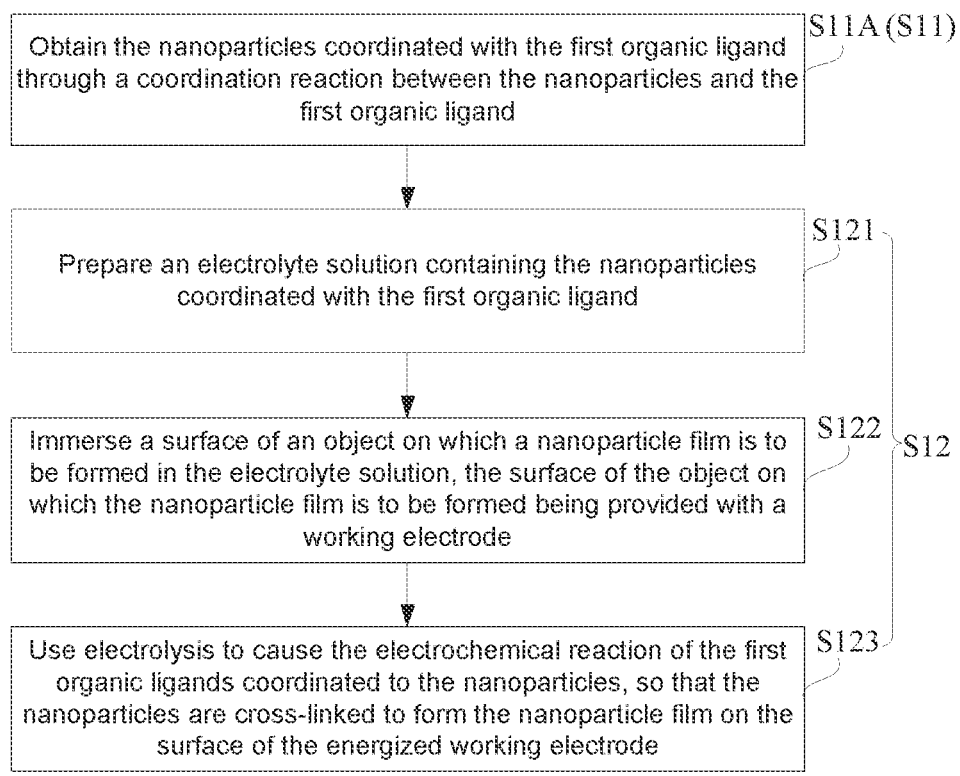
FIG. 2 is a flowchart of another method of manufacturing a nanoparticle film, in accordance with some embodiments.

In some embodiments, as shown in FIG. 2, after the first organic ligand is prepared, S11 includes:

S11A, obtaining the nanoparticles coordinated with the first organic ligand through a coordination reaction between the nanoparticles and the first organic ligand.

For example, in a case where the nanoparticles are core-shell nanocomposite particles, when the core-shell nanocomposite particles are prepared, the first organic ligand may be directly added, so that a coordination reaction occurs between the nanoparticles and the first organic ligand, so as to obtain the nanoparticles coordinated with the first organic ligand.

Figure 3:
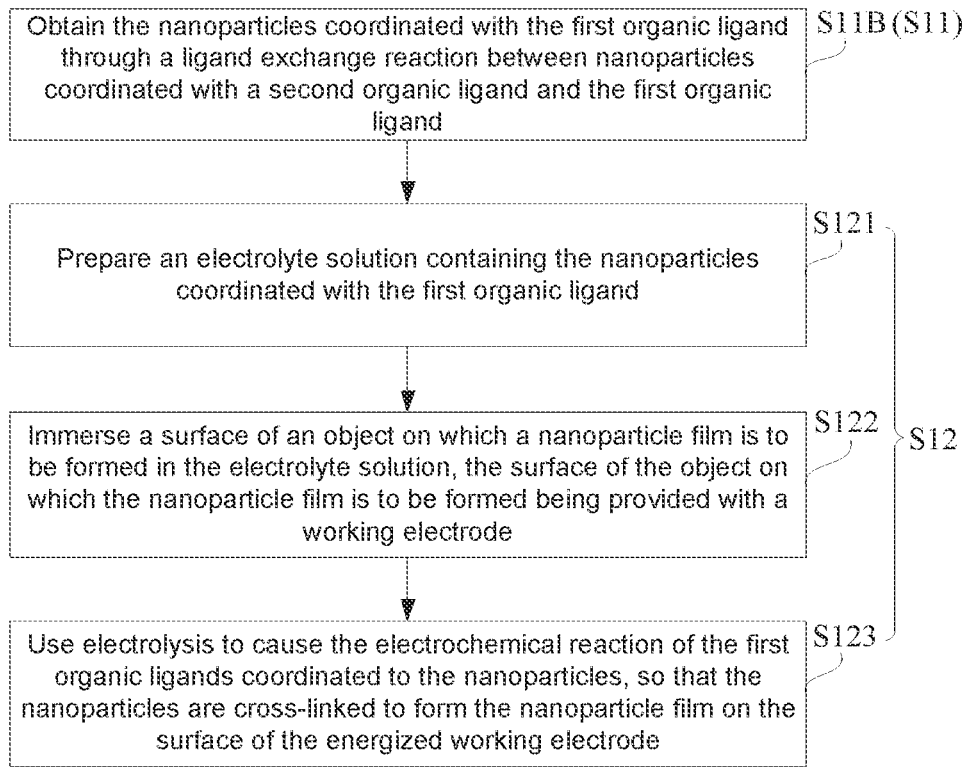
FIG. 3 is a flowchart of yet another method of manufacturing a nanoparticle film, in accordance with some embodiments.

In some other embodiments, as shown in FIG. 3, after the first organic ligand is prepared, the above S11 includes:

S11B, obtaining the nanoparticles coordinated with the first organic ligand through a ligand exchange reaction between nanoparticles coordinated with a second organic ligand and the first organic ligand.

For example, in the case where the nanoparticles are core-shell nanocomposite particles, when the core-shell nanocomposite particles are prepared, the second organic ligand may be directly added, so that a coordination reaction occurs between the nanoparticles and the second organic ligand, so as to obtain the nanoparticles coordinated with the second organic ligand. Then, a ligand exchange reaction occurs between the nanoparticles coordinated with the second organic ligand and the first organic ligand, so as to obtain the nanoparticles coordinated with the first organic ligand.

For example, the second organic ligand includes at least one of oleic acid, oleylamine, dodecyl mercaptan, octyl mercaptan, trioctyl phosphine, trioctyl phosphine oxide, and ethanolamine.

An equation (I) of the ligand exchange reaction is shown below by taking an example in which the second organic ligand is the oleic acid and the coordination group in the first organic ligand is the amino group. The chemical formula of the oleic acid is $CH_3(CH_2)_7CH=CH(CH_2)_7COOH$, and "OA" is short for "oleic acid".

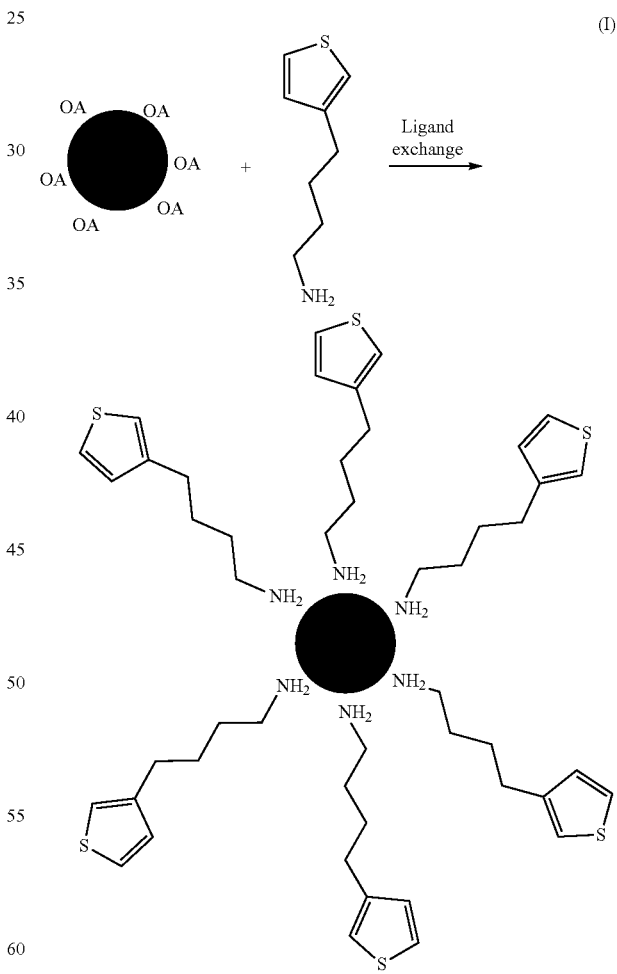

It can be seen from the equation (I) that, the nanoparticles coordinated with the first organic ligand are obtained after the ligand exchange reaction occurs between the nanoparticles coordinated with the second organic ligand and the first organic ligand.

In S12, an electrochemical reaction occurs between first organic ligands coordinated to nanoparticles, so that the nanoparticles are cross-linked to form the nanoparticle film on a surface of an energized working electrode.

In the above S12, the electrochemically active sites in the first organic ligand are usually located at $X_1$ and $Y_1$. In a case where the hydrogen atom at at least one electrochemically active site in the first organic ligand is not substituted by the substituent, under the action of electricity, an electrochemical reaction will occur between at least two adjacent first organic ligands to form multimers, such as dimers, trimers, and tetramers, so that the nanoparticles coordinated with the first organic ligands are cross-linked to form a thin film near the energized working electrode (for example, on the surface of the working electrode).

For example, in a case where the first organic ligand is any one of a thiophene derivative, a pyrrole derivative, a furan derivative, an aniline derivative and a diphenyl ether derivative, if $X_1$ is the hydrogen atom and $Y_1$ is one of a hydrocarbon group, an ester group, an ether group, an amide group and an aromatic group, in the electrochemical reaction, except that the aniline derivative can form dimers, trimers and tetramers, other types of first organic ligands all form dimers. In a case where $X_1$ and $Y_1$ are both hydrogen atoms, in the electrochemical reaction, all the above first organic ligands can form dimers, trimers, tetramers, etc.

For example, structural formulas of several first organic ligands after polymerization are as follows.

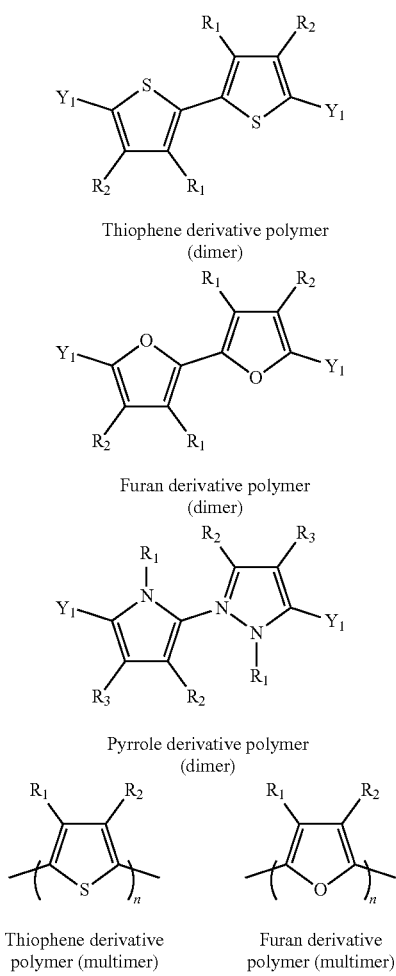

Thiophene derivative polymer (dimer)

Furan derivative polymer (dimer)

Pyrrole derivative polymer (dimer)

Thiophene derivative polymer (multimer)

Furan derivative polymer (multimer)

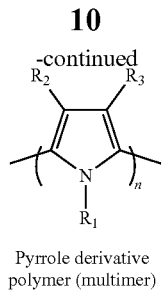

Pyrrole derivative polymer (multimer)

Figure 5:
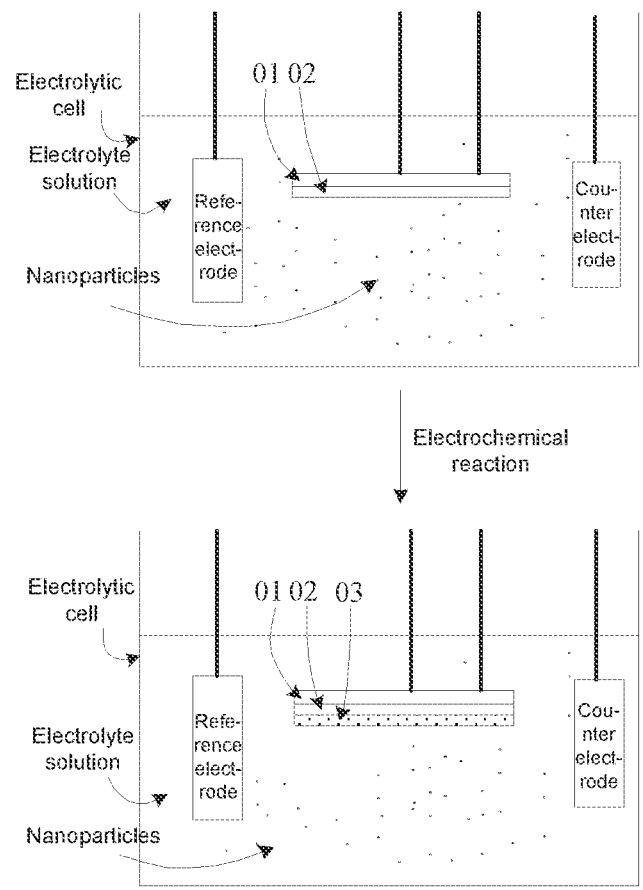
FIG. 5 is a schematic diagram of a method of manufacturing a nanoparticle film, in accordance with some embodiments.

In some embodiments, referring to FIGS. 2, 3 and 5, S12 includes:

S121, preparing an electrolyte solution containing the nanoparticles coordinated with the first organic ligand;

S122, immersing a surface of an object 01 on which a nanoparticle film is to be formed in the electrolyte solution, the surface of the object 01 on which the nanoparticle film is to be formed being provided with a working electrode 02; and S123, using electrolysis to cause the electrochemical reaction of the first organic ligands coordinated to the nanoparticles, so that the nanoparticles are cross-linked to form the nanoparticle film 03 on the surface of the energized working electrode 02.

In S121, a method of preparing the electrolyte solution containing the nanoparticles coordinated with the first organic ligand may be: adding the nanoparticles coordinated with the first organic ligand to an electrolytic cell, adding a certain amount of electrolyte, and mixing them to form the electrolyte solution containing the nanoparticles coordinated with the first organic ligand.

Optionally, the electrolyte may be a tetra-n-butylammonium hexafluorophosphate solution, and a concentration of tetra-n-butylammonium hexafluorophosphate in the solution may be 0.1 mol/L.

For example, in practical applications, a shape of the formed nanoparticle film 03 depends on a shape of the working electrode 02. Therefore, a plurality of working electrodes 02 may be provided on the surface of the object 01 on which nanoparticle films are to be formed, so that a nanoparticle film 03 can be formed on the surface of each working electrode 02, and the nanoparticle films 03 formed on different working electrodes 02 may be separated from one another. In addition, the working electrode 02 itself may also be in a shape of a certain pattern, so that a nanoparticle film with a desired pattern may be formed.

In some embodiments, the method of manufacturing the nanoparticle film may be applied to manufacture of a light-emitting layer of a display substrate in an active light-emitting display apparatus. By using an anode of the light-emitting device of the display substrate as the working electrode, and immersing the anode in the electrolyte solution and energizing it, it may be possible to form the nanoparticle film, i.e., the light-emitting layer, on a side of the anode away from the backplane of the display substrate.

In S12, the electrochemical reaction may use a three-electrode system, and the three electrodes are a working electrode, a counter electrode and a reference electrode.

The working electrode 02, also known as a research electrode, refers to an electrode where a reaction to be studied (i.e., the electrochemical reaction) occurs. For example, the working electrode may be made of at least one of platinum, gold, nickel, a transparent oxide conductive material (such as indium tin oxide (ITO)), and stainless steel.

The counter electrode, also known as an auxiliary electrode, functions to form a loop with the working electrode to allow current to flow through. Optionally, the counter electrode may adopt an inert conductive material, such as titanium or platinum.

The reference electrode is an electrode whose potential is known and can be kept stable. Optionally, the reference electrode may be a saturated calomel electrode (SCE), or an Ag/AgCl electrode (silver/silver chloride electrode).

In the electrochemical reaction process, the reference electrode, through which no current passes, is used as a standard to measure the potential of the working electrode, while a loop is formed between the counter electrode and the working electrode, through which current flows.

In S12, with the nanoparticles coordinated with the first organic ligand prepared according to S11B as an example, the equation of the electrochemical reaction is as follows.

(II)
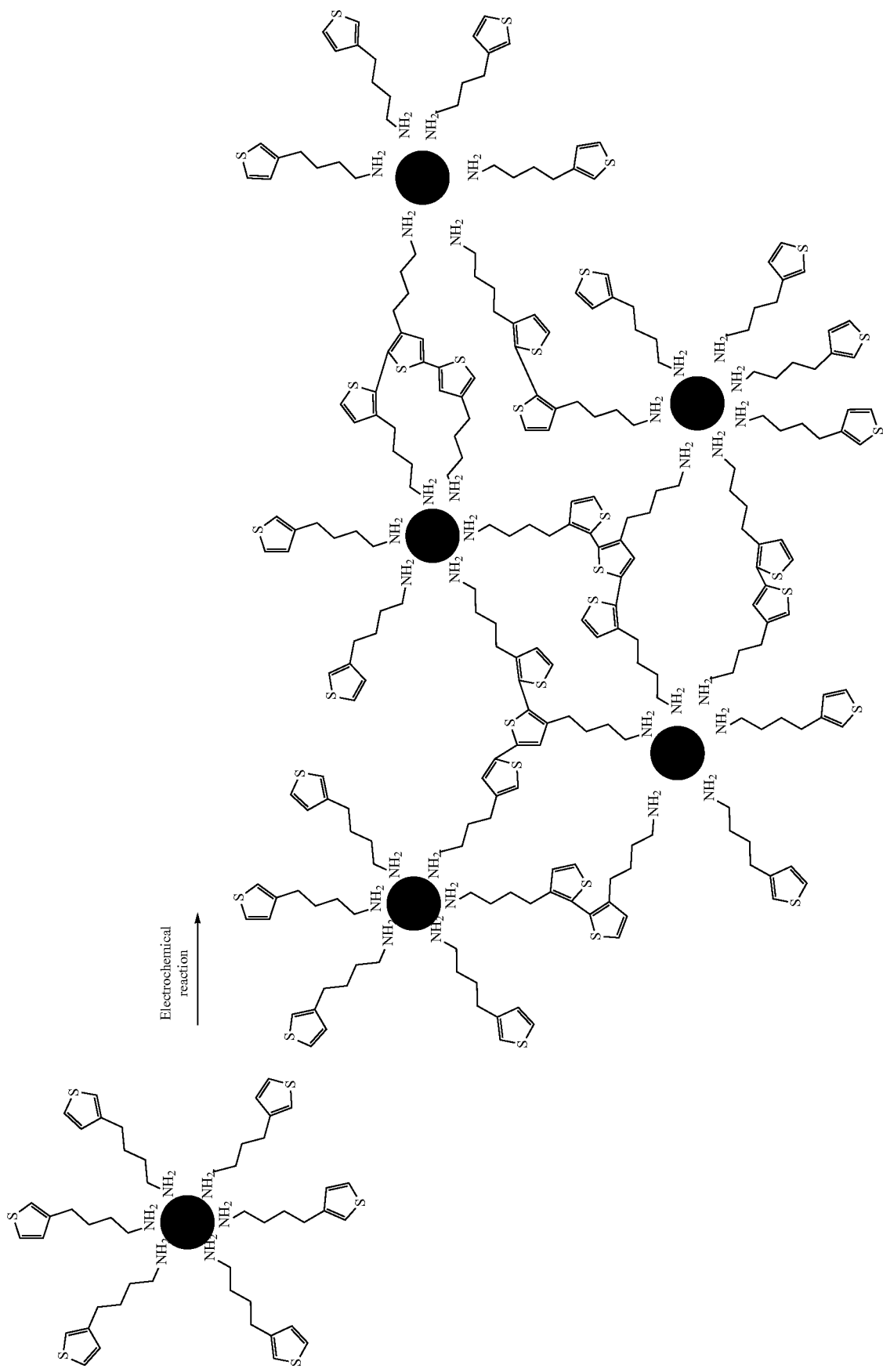

The electrochemical reaction may be realized by any one of a cyclic voltammetry mode, a constant potential mode, a constant current mode and a pulse polarization mode.

The cyclic voltammetry mode is to control a potential applied to the working electrode 02 to perform one or more scans in a triangular waveform at different rates over time. The constant potential mode is to apply a constant voltage to the working electrode 02. The constant current mode is to apply a constant current to the working electrode 02. The pulse polarization mode is to apply a pulsed periodic voltage to the working electrode 02.

For example, in a case where the cyclic voltammetry mode is adopted, before the nanoparticle film is formed, the potential applied to the working electrode 02 is controlled to perform one or more scans in the triangular waveform at different rates over time, and a current-potential curve is recorded to obtain a cyclic voltammetry curve of the electrolyte solution to be used. Then, appropriate conditions are selected according to the cyclic voltammetry curve, and the working electrode 02 is energized, so that the electrochemical reaction occurs when the conditions for the electrochemical reaction of the electrochemically active groups of the first organic ligands coordinated to the nanoparticles are the best.

In the method of manufacturing the nanoparticle film provided by the embodiments of the present disclosure, the nanoparticles coordinated with the first organic ligand are prepared first. Since the first organic ligand contains the electrochemically active group(s) that is capable of undergoing the electrochemical reaction, the nanoparticles coordinated with the first organic ligands can be cross-linked through the electrochemical reaction to form the nanoparticle film on the surface of the energized working electrode 02. The pattern or shape of the formed nanoparticle film depends on the pattern or shape of the working electrode 02. Compared with film forming methods such as printing, transfer, and photolithography, the method of manufacturing the nanoparticle film described above does not require alignment, and therefore has higher film formation accuracy.

Figure 6:
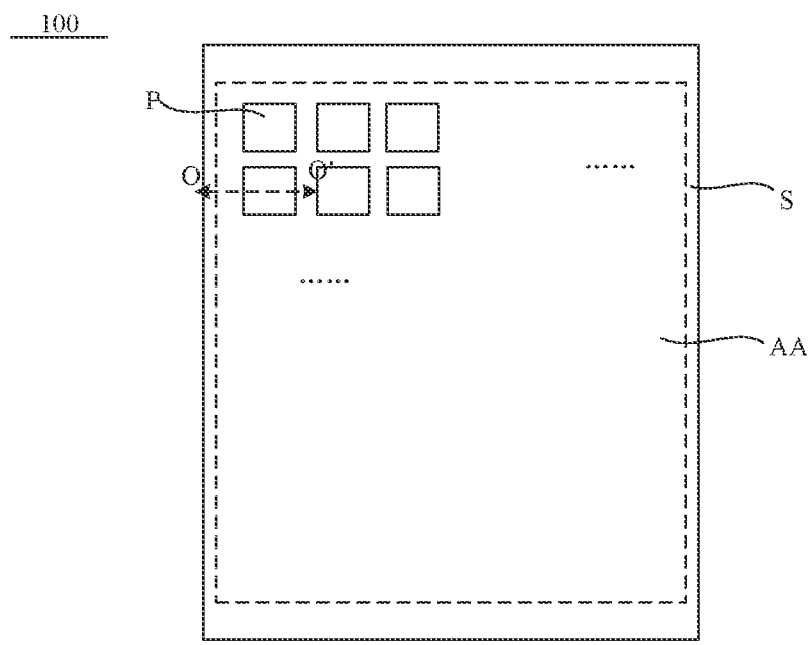
FIG. 6 is a top view of a display substrate, in accordance with some embodiments.

Referring to FIG. 6, some embodiments of the present disclosure provide a display substrate 100. The display substrate 100 has a display area AA and a peripheral area S located at a periphery of the display area AA. The peripheral area S is used for wiring, and the peripheral area S may also be used for accommodating a driving circuit. The display area A includes a plurality of sub-pixel regions P, and each sub-pixel region P is provided with a sub-pixel.

Figure 7:
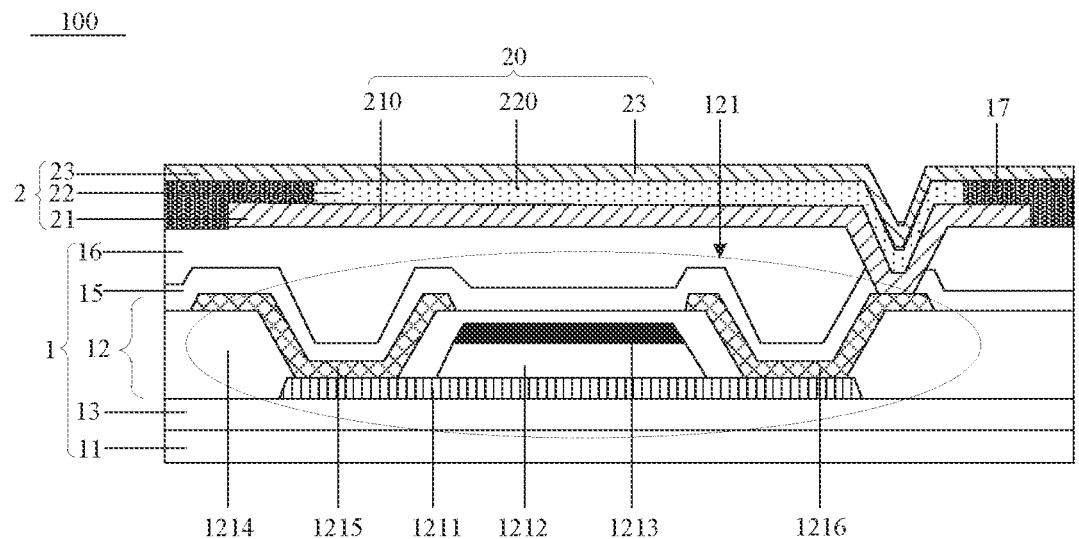
FIG. 7 is a section view of the display substrate shown in FIG. 6 taken along line OO'.

FIG. 7 is a section view of the display substrate 100 taken along line OO' of the display substrate 100 shown in FIG. 6. The display substrate 100 includes a backplane 1 and a QLED light-emitting device layer 2 disposed on a side of the backplane 1.

The backplane 1 includes a base 11 and a pixel driving circuit layer 12 disposed above the base 11. The pixel driving circuit layer 12 includes a plurality of pixel driving circuits. Each sub-pixel region P is provided therein with a pixel driving circuit, and the pixel driving circuit is used for driving a corresponding sub-pixel to emit light. Each pixel driving circuit includes at least one thin film transistor 121, a gate line, and a data line. The at least one thin film transistor 121 may include a switching transistor and a driving transistor.

For example, the thin film transistor 121 may include an active layer 1211, a gate insulating layer 1212, a gate 1213, an interlayer insulating layer 1214, a source 1215, and a drain 1216 that are sequentially stacked on the base 11. The source 1215 and the drain 1216 may be made of a same material and disposed in a same layer.

It will be noted that, FIG. 7 is an illustration by taking an example in which the thin film transistor 121 is of a top-gate structure. However, the thin film transistor 121 included in the display substrate 100 provided in the embodiments of the present disclosure may also be of a bottom-gate structure. In such case, the thin film transistor includes a gate, a gate insulating layer, an active layer, a source, and a drain that are sequentially stacked above the base 11. Moreover, the embodiments of the present disclosure are not limited thereto.

In some embodiments, the backplane 1 further includes: a buffer layer 13 disposed between the base 11 and the pixel driving circuit layer 12, and a passivation layer 15 and a planarization layer 16 disposed on a side of the pixel driving circuit layer 12 away from the base 11. The passivation layer 15 and the planarization layer 16 are provided with a via hole for exposing the source 1215 or the drain 1216 of the thin film transistor 121, so that an anode of a light-emitting device is coupled to the source 1215 or the drain 1216 of the thin film transistor 121 through the via hole. FIG. 7 only shows a case where the via hole exposes the drain 1216 of the thin film transistor 121.

The passivation layer 15 may be made of an inorganic material, and the planarization layer 16 may be made of an organic material.

As shown in FIG. 7, in some embodiments, the QLED light-emitting device layer 2 provided at a side of the backplane 1 includes a first electrode layer 21 disposed on a side of the planarization layer 16 away from the base 11, a light-emitting layer 22 disposed on a side of the first electrode layer 21 away from the base 11, and a second electrode layer 23 disposed on a side of the light-emitting layer 22 away from the base 11.

In some embodiments, in the QLED light-emitting device layer 2, the light-emitting layer 22 includes nanoparticles and a product that is obtained by an electrochemical reaction of electrochemically active groups contained in first organic ligands coordinated to the nanoparticles. The nanoparticles are cross-linked together through the product.

The light-emitting layer 22 may be manufactured by the method of manufacturing the nanoparticle film described above. That is, the first electrode layer 21 of the display substrate 100 is used as the working electrode 02 required in the method of manufacturing the nanoparticle film, and the first electrode layer 21 is energized to cause the electrochemical reaction of the first organic ligands coordinated to the nanoparticles, so that the nanoparticles are cross-linked together to form the light-emitting layer 22 on a side of the first electrode layer 21 away from the base 11.

Since the light-emitting layer 22 of the display substrate 100 provided by the embodiments of the present disclosure is manufactured by the method of manufacturing the nanoparticle film described above, the film formation accuracy of the light-emitting layer 22 is higher, which helps to realize manufacturing of high-resolution display apparatuses.

For example, the nanoparticles in the light-emitting layer 22 include quantum dots. A material of the quantum dots may include at least one of a silicon material, a germanium material, a cadmium sulfide material, a cadmium selenide material, a cadmium telluride material, a zinc selenide material, a lead sulfide material, a lead selenide material, an indium phosphide material, and an indium arsenide material.

For example, the nanoparticles may be core-shell nanocomposite particles. The term "core-shell" means that the nanoparticle includes an outer shell and an inner core encapsulated by the outer shell, and the outer shell and the inner core may both be made of an inorganic material. For example, the nanoparticles are CdSe/ZnS nanocomposite particles, in which CdSe is the inner core and ZnS is the outer shell.

For example, a material of the first organic ligand includes at least one of a thiophene derivative, a pyrrole derivative, a furan derivative, an aniline derivative, and a diphenyl ether derivative.

For example, the first organic ligand includes coordination groups, and the coordination groups are configured to coordinate with the nanoparticles. The coordination group includes at least one of amino, hydroxyl, carboxyl, a mercapto group, thioether, phosphine, phosphine oxide.

In some embodiments, in the QLED light-emitting device layer 2, a material of the first electrode layer 21 may be a conductive material with a low work function, such as silver (Ag), aluminum (Al), calcium (Ca), indium (In), lithium (Li), magnesium (Mg), or other metals.

A material of the second electrode layer 23 may be a material with a high work function, such as ITO, indium zinc oxide (IZO), or other transparent metal oxide conductive materials.

Figure 8:
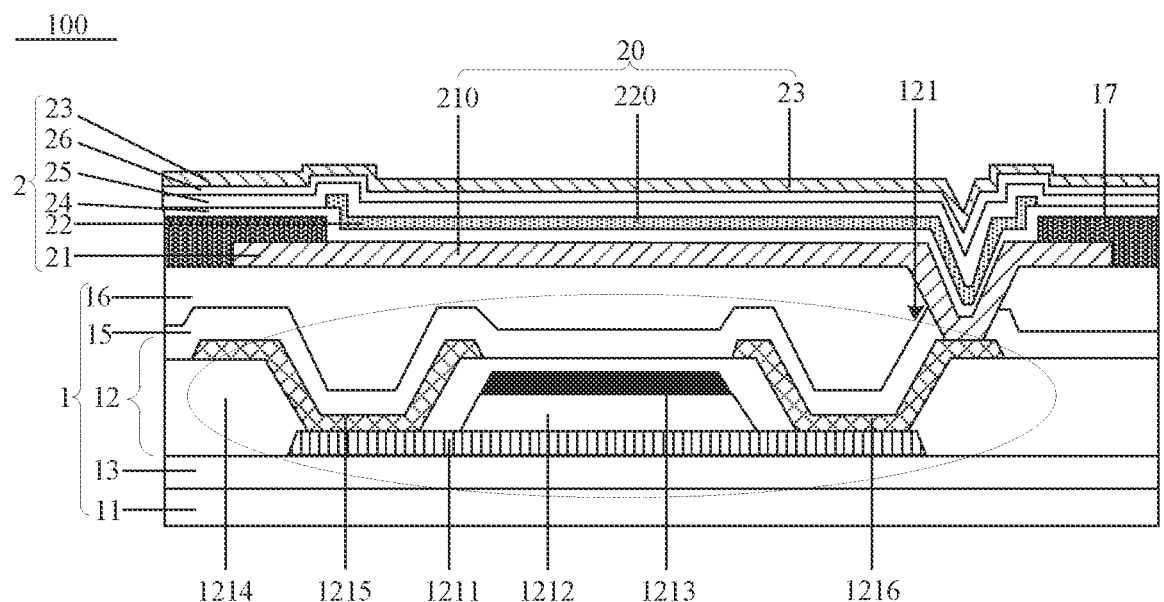
FIG. 8 is a section view of a display substrate, in accordance with some embodiments.

In some embodiments, as shown in FIG. 8, the QLED light-emitting device layer 2 further includes a hole transport layer (HTL) 24 and/or a hole injection layer (HIL) disposed between the first electrode layer 21 and the light-emitting layer 22. FIG. 8 shows a case where the QLED light-emitting device layer 2 further includes the HTL 24.

In addition, as shown in FIG. 8, the QLED light-emitting device layer 2 further includes an electron transport layer 25 (ETL) and/or an electron injection layer 26 (EIL) disposed between the light-emitting layer 22 and the second electrode layer 23. FIG. 8 shows a case where the QLED light-emitting device layer 2 further includes both the ETL 25 and the EIL 26.

With continued reference to FIG. 7, in the display substrate 100 provided by the embodiments of the present disclosure, the QLED light-emitting device layer 2 includes a plurality of QLED light-emitting devices 20, and each sub-pixel region P is provided therein with a QLED light-emitting device 20. The QLED light-emitting device 20 includes a sub-electrode 210 located in the first electrode layer 21, a light-emitting portion 220 located in the light-emitting layer 22, and a portion of the second electrode layer 23 that is located in a corresponding sub-pixel region P.

The sub-electrode 210 of the QLED light-emitting device 20 located in the first electrode layer 21 is used as an anode, and is coupled to the pixel driving circuit in the sub-pixel region P. The sub-electrode 210 of the QLED light-emitting device 20 used as the anode is coupled to the source 1215 or the drain 1216 of the thin film transistor 121 in the corresponding pixel driving circuit through the via hole that penetrates the passivation layer 15 and the planarization layer 16. Therefore, the pixel driving circuit can be used to apply a data voltage to the anode of the QLED light-emitting device 20, and the portion of the second electrode layer 23 that is located in the corresponding sub-pixel region P included in the QLED light-emitting device 20 can be used as a cathode for receiving a voltage. In this way, an electric field is formed between the sub-electrode 210 (i.e., the anode) of the QLED light-emitting device 20 located in the first electrode layer 21 and the portion of the second electrode layer 23 (i.e., the cathode) that is located in the corresponding sub-pixel region P, so as to drive the light-emitting portion 220 of the light-emitting layer 22 to emit light.

It will be noted that, cathodes of the plurality of QLED light-emitting devices 20 may be connected to one another to form a planar electrode structure covering an entire surface. That is, the second electrode layer 23 is one-piece structure and is a whole layer. FIG. 7 only shows a portion of the second electrode layer 23 that is used as the cathode of a QLED light-emitting device 20.

In some embodiments, the display substrate 100 further includes a pixel defining layer disposed on the side of the first electrode layer 21 away from the base 11, and the pixel defining layer has a plurality of openings. One QLED light-emitting device 20 corresponds to one opening, and the entire or a large part of the light-emitting portion 220 of the QLED light-emitting device 20 is located in the opening.

In some embodiments, in order to enable the display substrate 100 to realize full-color display, the plurality of QLED light-emitting devices 20 includes a plurality of QLED light-emitting devices capable of emitting light of a first color, a plurality of QLED light-emitting devices capable of emitting light of a second color, and a plurality of QLED light-emitting devices capable of emitting light of a third color. The first color, the second color and the third color are three primary colors. For example, the three primary colors are red, green and blue.

In this case, the light-emitting layer 22 includes first light-emitting portions capable of emitting light of the first color, second light-emitting portions capable of emitting light of the second color, and third light-emitting portions capable of emitting light of the third color. Correspondingly, the first electrode layer 21 includes first sub-electrodes located on respective sides of the first light-emitting portions proximate to the backplane 1, second sub-electrodes located on respective sides of the second light-emitting portions proximate to the backplane 1, and third sub-electrodes located on respective sides of the third light-emitting portions proximate to the backplane 1.

The first light-emitting portions capable of emitting light of the first color, the second light-emitting portions capable of emitting light of the second color and the third light-emitting portions capable of emitting light of the third color may be formed by using different nanoparticle materials. Herein, the "different nanoparticle materials" refer to nanoparticle materials with at least one of different particle sizes and different types of materials, as long as the nanoparticle materials can emit light of different colors in an excited state.

At least one of the first light-emitting portions, the second light-emitting portions and the third light-emitting portions included in the light-emitting layer 22 is manufactured by using the method of manufacturing the nanoparticle film described above. For example, the first light-emitting portions, the second light-emitting portions and the third light-emitting portions are all manufactured by using the method of manufacturing the nanoparticle film described above.

In a case where the first light-emitting portions, the second light-emitting portions and the third light-emitting portions are all manufactured by using the method of manufacturing the nanoparticle film described above, the first sub-electrodes, the second sub-electrodes and the third sub-electrodes may be used as the working electrodes in sequence. That is, corresponding sub-electrodes are energized, and other sub-electrodes are not energized. Then, the electrochemical reaction occurs among the first organic ligands coordinated to corresponding nanoparticles, so that the nanoparticles are cross-linked to form corresponding light-emitting portions.

It will be noted that, in some embodiments, the QLED light-emitting device 20 may be a top-emission light-emitting device (which emits light in a direction away from the backplane 1), or a bottom-emission light-emitting device (which emits light in a direction toward the backplane 1), or a double-sided emission light-emitting device (which emits light in both the direction away from the backplane 1 and the direction toward the backplane 1).

For example, in a case where the QLED light-emitting device 20 is a top-emission light-emitting device, the first electrode layer 21 more proximate to the backplane 1 is opaque, and the second electrode layer 23 farther away from the backplane 1 is transparent or semi-transparent. In a case where the QLED light-emitting device 20 is a bottom-emission light-emitting device, the first electrode layer 21 more proximate to the backplane 1 is transparent or semi-transparent, and the second electrode layer 23 farther away from the backplane 11 is opaque. In a case where the QLED light-emitting device 20 is a double-sided emission light-emitting device, the first electrode layer 21 more proximate to the backplane 1 and the second electrode layer 23 farther away from the backplane 11 are both transparent or are both semi-transparent.

Figure 9:
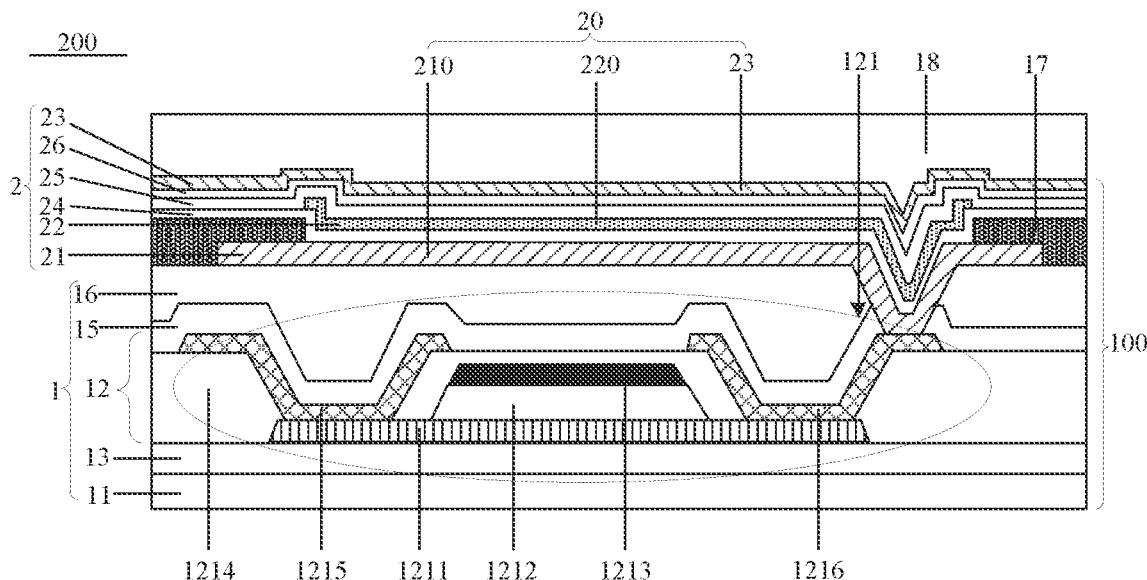
FIG. 9 is a schematic diagram of a display apparatus, in accordance with some embodiments.

As shown in FIG. 9, some embodiments of the present disclosure provide a display apparatus 200. The display apparatus 200 includes the display substrate 100 described in the above embodiments.

In some examples, the display apparatus 200 further includes an encapsulation structure 18 for encapsulating the display substrate 100. For example, the encapsulation structure 18 may be an encapsulation film or an encapsulation substrate. In a case where the encapsulation structure 18 is an encapsulation film, the encapsulation structure 18 may be a stacked structure formed of at least three layers of films that are sequentially stacked. A film closest to the display substrate 100 and a film farthest away from the display substrate 100 in the stacked structure may both be inorganic films, and a film between the two adjacent inorganic films may be an organic film.

In some embodiments, in addition to the display substrate 100 and the encapsulation structure 18, the display apparatus 200 further includes components such as driving circuit(s), a system motherboard, and a casing.

The display apparatus 200 provided by the embodiments of the present disclosure may be any apparatus that displays an image whether in motion (for example, a video) or fixed (for example, a still image), and regardless of literal or graphical. More specifically, it is contemplated that the described embodiments may be implemented in or associated with a variety of electronic devices. The variety of electronic devices may include (but are not limited to), for example, mobile phones, wireless devices, personal data assistants (PDAs), hand-held or portable computers, global positioning system (GPS) receivers/navigators, cameras, MPEG-4 Part 14 (MP4) video players, video cameras, game consoles, watches, clocks, calculators, TV monitors, flat panel displays, computer monitors, car displays (such as odometer displays), navigators, cockpit controllers and/or displays, camera view displays (such as rear view camera displays in a vehicle), electronic photos, electronic billboards or signages, projectors, building structures, packaging and aesthetic structures (such as a display for an image of a piece of jewelry).

Figure 10:
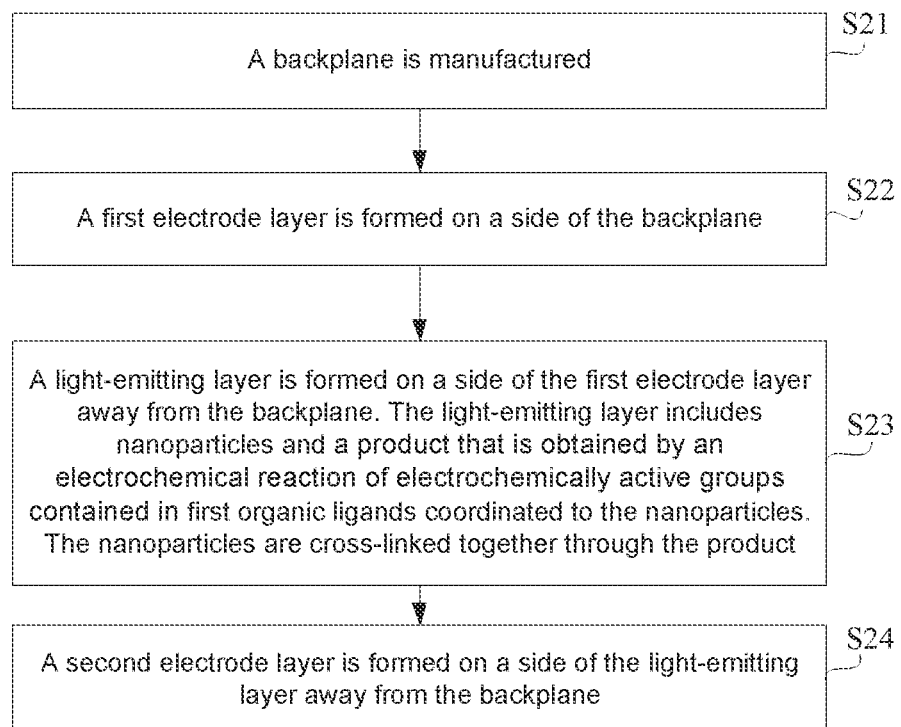
FIG. 10 is a flowchart of a method of manufacturing a display substrate, in accordance with some embodiments.

As shown in FIG. 10, some embodiments of the present disclosure provide a method of manufacturing a display substrate. The method includes steps 21 to 24 (S21~S24).

In S21, as shown in FIG. 12, a backplane 1 is manufactured.

In S21, for example, manufacturing the backplane 1 includes: forming a buffer layer 13 on a base 11 by using a film forming process such as evaporation, chemical vapor deposition (CVD), or sputtering; and forming a pixel driving circuit layer 12 on a side of the buffer layer 13 away from the base 11 by film forming processes (such as evaporation, CVD, and sputtering) and photolithography processes.

The pixel driving circuit layer 12 includes at least one thin film transistor 121, gate lines, and data lines. The at least one thin film transistor 121 may include a switching transistor and a driving transistor.

For example, the thin film transistor 121 includes an active layer 1211, a gate insulating layer 1212, a gate 1213, an interlayer insulating layer 1214, a source 1215, and a drain 1216 that are sequentially stacked above the base 11. The source 1215 and the drain 1216 may be made of a same material and disposed in a same layer.

It will be noted that, FIG. 12 is an illustration by taking an example in which the thin film transistor 121 is of a top-gate structure, but the embodiments of the present disclosure are not limited thereto.

In some embodiments, after the pixel driving circuit layer 12 is manufactured, a passivation layer 15 and a planarization layer 16 may be sequentially formed on the pixel driving circuit layer 12, and a photolithography process is used for forming via hole(s) in both the passivation layer 15 and the planarization layer 16 at position(s) corresponding to the source(s) 1215 or the drain(s) 1216 of the thin film transistor(s) 121, so as to expose the source(s) 1215 or the drain(s) 1216 of the thin film transistor(s) 121. FIG. 12 only shows a case where the via hole exposes the drain 1216 of the thin film transistor 121.

Figure 13:
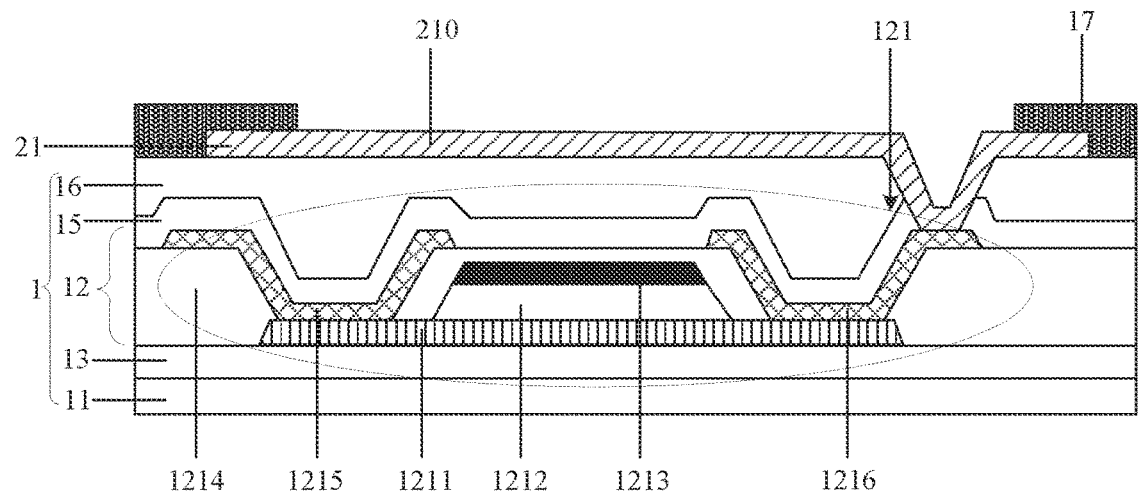

In S22, as shown in FIG. 13, a first electrode layer 21 is formed on a side of the backplane 1.

In some embodiments, the first electrode layer 21 is formed on the side of the backplane 1 by a film forming process (such as evaporation, CVD, or sputtering) and a photolithography process, and the first electrode layer 21 includes a plurality of first sub-electrodes 210. The first sub-electrode 210 may be used as an anode of a QLED light-emitting device. The first electrode layer 21 may be made of indium tin oxide (ITO).

For example, after the first electrode layer 21 is formed on the side of the backplane 1, the display substrate 100 on which the first electrode layer 21 has been formed may be cleaned with deionized water and ethanol, and ultrasonically treated for 20 minutes. Then, the display substrate 100 is quickly dried by using a nitrogen gun and treated with ozone for 10 minutes, so as to clean the surface of the first electrode layer 21 and thereby improve a work function of the first sub-electrode 210 (i.e., the anode) in the first electrode layer 21.

For example, after the first electrode layer 21 is formed on the side of the backplane 1, a pixel defining layer 17 is formed on a side of the first electrode layer 21 away from the backplane 1, and a plurality of openings corresponding to the plurality of sub-pixel regions are formed in the pixel defining layer 17 by using a photolithography process.

Figure 15:
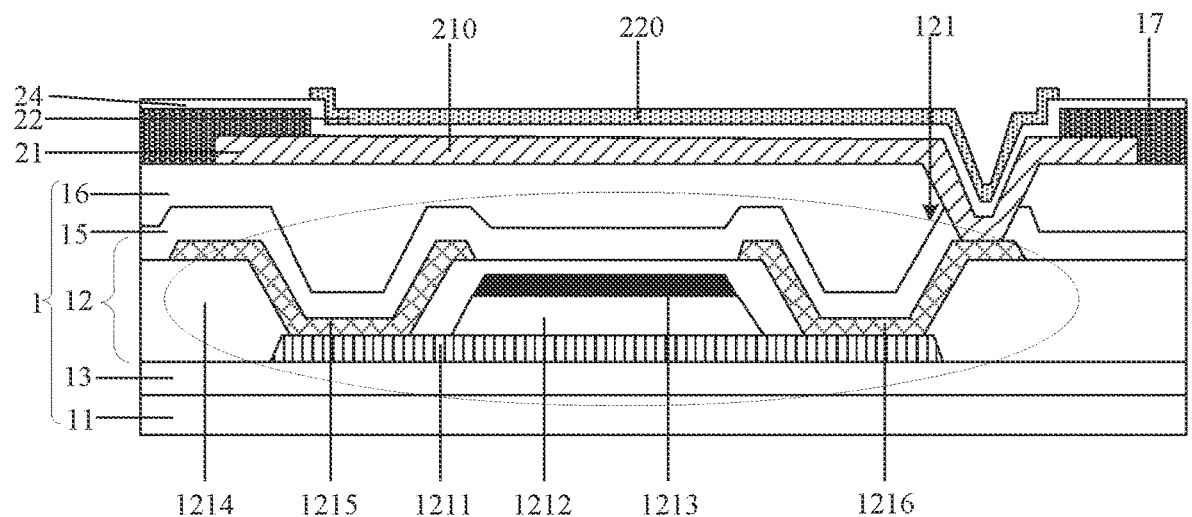

In S23, as shown in FIG. 15, a light-emitting layer 22 is formed on a side of the first electrode layer 21 away from the backplane 1. The light-emitting layer 22 includes nanoparticles and a product that is obtained by an electrochemical reaction of electrochemically active groups contained in first organic ligands coordinated to the nanoparticles. The nanoparticles are cross-linked together through the product.

Figure 14:
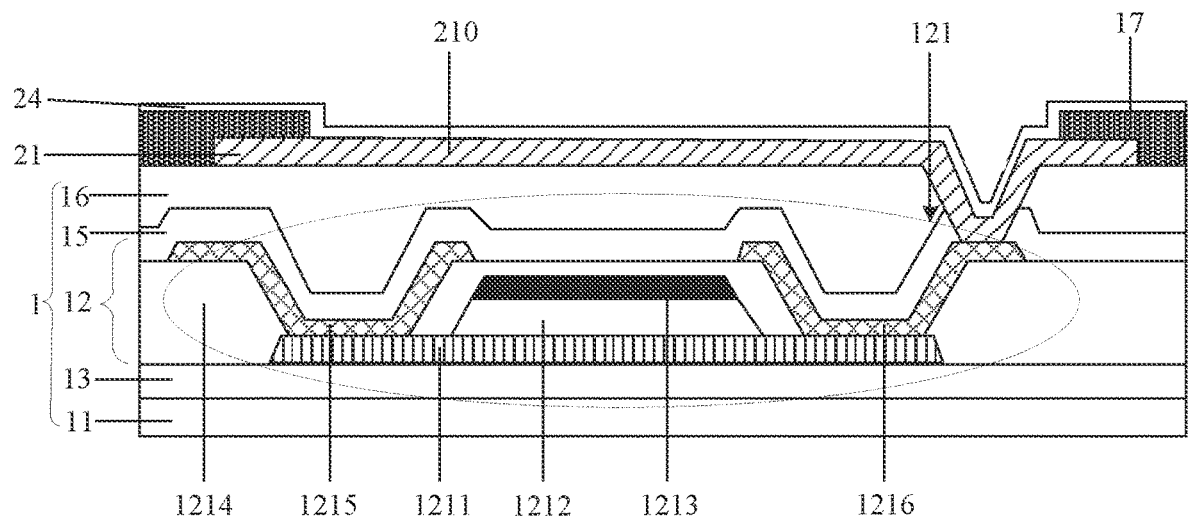

As shown in FIG. 14, in some embodiments, before the light-emitting layer 22 is formed, a HTL 24 may be formed on a surface of the display substrate 100 on which the first electrode layer 21 has been formed by using a film forming process such as spin coating or printing. The HTL 24 may be made of, for example, N,N'-diphenyl-N,N'-(1-naphthyl)-1,1'-biphenyl-4,4'-diamine (NPB), and a thickness of the HTL 24 may be 30 nm.

As shown in FIG. 15, the light-emitting layer 22 is formed on a side of the HTL 24 away from the backplane 1. In this step, the light-emitting layer 22 may be manufactured by the method of manufacturing the nanoparticle film as described in some of the above embodiments.

The step of manufacturing the light-emitting layer 22 (i.e., S23) includes: firstly, preparing the nanoparticles coordinated with the first organic ligand, the first organic ligand containing the electrochemically active group(s) capable of undergoing the electrochemical reaction, and the nanoparticles being made of a material required for forming the light-emitting layer 22; secondly, energizing the first electrode layer 21 to cause the electrochemical reaction of the first organic ligands coordinated to the nanoparticles, so that the nanoparticles are cross-linked to form a nanoparticle film 22 on a surface of the first electrode layer 21, the nanoparticle film being the light-emitting layer 22.

As for the step of preparing the nanoparticles coordinated with the first organic ligand, reference may be made to relevant description of the method of manufacturing the nanoparticle film described above, and details will not be repeated here.

Figure 18:
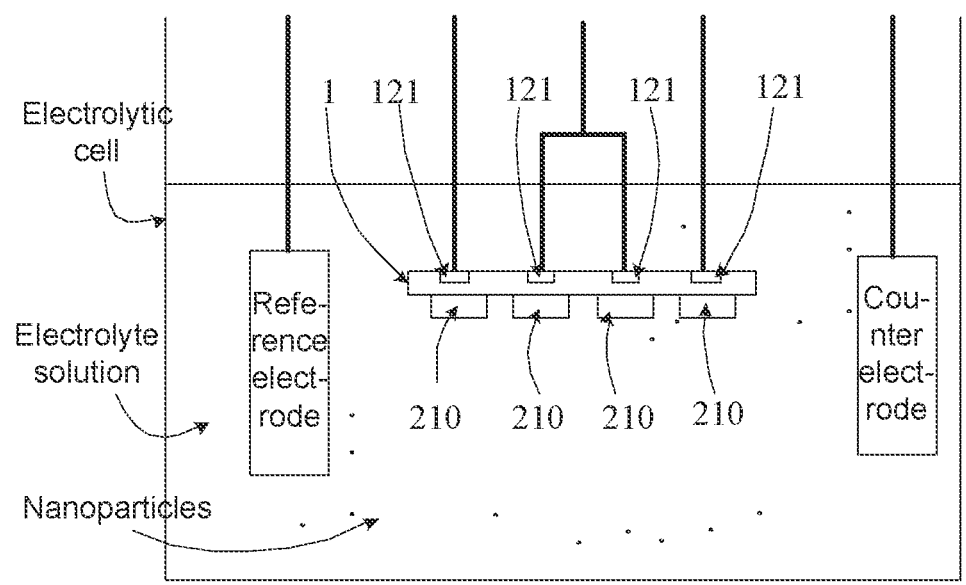
FIGS. 18 to 21 are diagrams showing steps of manufacturing alight-emitting layer in a method of manufacturing a display substrate, in accordance with some embodiments.

As for the step of "energizing the first electrode layer 21 to cause the electrochemical reaction of the first organic ligands coordinated to the nanoparticles, so that the nanoparticles are cross-linked to form a nanoparticle film 22 on a surface of the first electrode layer 21, the nanoparticle film being the light-emitting layer 22", firstly, an electrolyte solution containing the nanoparticles coordinated with the first organic ligand needs to be prepared. Secondly, as shown in FIG. 18, the backplane 1 on which the first electrode layer 21 has been formed is immersed in the electrolyte solution of an electrolytic cell. The electrolyte solution of the electrolytic cell contains a nanoparticle material for forming the light-emitting layer 22, and the nanoparticle material is coordinated with the first organic ligand containing the electrochemically active group(s). Then, the first electrode layer 21 that is used as the working electrode is energized, so that electrolysis is used to cause the electrochemical reaction of the first organic ligands in the electrolyte solution, and the nanoparticles are cross-linked to form the light-emitting layer 22 on the surface of the first electrode layer 21 away from the backplane 1.

With continued reference to FIG. 18, the backplane 1 includes the pixel driving circuit layer 12, the pixel driving circuit layer 12 includes a plurality of pixel driving circuits (the pixel driving circuits are illustrated by the thin film transistors 121 in FIG. 18), the first electrode layer 21 includes a plurality of sub-electrodes 210, and each sub-electrode 210 is coupled to a pixel driving circuit. Therefore, a method of energizing the first electrode layer 21 is to energize the thin film transistors 121 of the pixel driving circuits, so as to energize the sub-electrodes 210 coupled to the pixel driving circuits, that is, to energize the first electrode layer 21.

In some embodiments, in an example where the nanoparticle material required for forming the light-emitting layer 22 is quantum dots, the quantum dots are CdSe/ZnS nanocomposite particles, the first organic ligand is a thiophene derivative, and a second organic ligand is oleic acid, a method of preparing the electrolyte solution containing nanoparticles includes: preparing the nanoparticles coordinated with the first organic ligand first. Preparing the nanoparticles coordinated with the first organic ligand includes: dissolving 50 mg of the first organic ligands (thiophene derivative) containing the electrochemically active groups in 10 ml of chloroform, mixing them with a chloroform solution (10 ml, 50 mg/ml) of nanoparticles (CdSe/ZnS nanocomposite particles) coordinated with the second organic ligands (oleic acid), and stirring them for 8 hours under protection of nitrogen to carry out a ligand exchange reaction; then adding 20 ml of methanol after the reaction is over; when the solution becomes turbid, putting the turbid solution in a centrifuge tube to centrifuge at 4000 rpm for 3-5 minutes, so as to produce a precipitation on a wall of the centrifuge tube; and re-dissolving the precipitation in 20 ml of chloroform to obtain the nanoparticles coordinated with the first organic ligands.

The nanoparticles coordinated with the first organic ligands are added in an electrolytic cell, and an electrolyte is added in the electrolytic cell. The electrolyte is, for example, a tetra-n-butylammonium hexafluorophosphate solution, and the concentration may be 0.1 mol/L.

The nanoparticles have low resistance to water and oxygen. Therefore, by carrying out the ligand exchange reaction under the protection of nitrogen, it may be possible to effectively block water and oxygen.

In some other embodiments, a ligand exchange reaction is carried out between an aniline derivative (the first organic ligands) having the electrochemically active groups and the CdSe/ZnS nanocomposite particles (quantum dots) coordinated with oleylamine (the second organic ligands) to obtain the nanoparticles coordinated with the first organic ligands.

In yet some other embodiments, during synthesis of the CdSe/ZnS nanocomposite particles (the nanoparticles), a thiophene derivative (the first organic ligands) having the electrochemically active groups is directly added, so that a coordination reaction occurs between the CdSe/ZnS nanocomposite particles and the thiophene derivative, and the nanoparticles coordinated with the first organic ligands are obtained.

In some embodiments, a three-electrode system is adopted for the electrochemical reaction. A titanium sheet is used as a counter electrode, an Ag/AgCl electrode is used as a reference electrode, and the first electrode layer 21 is used as a working electrode.

For example, first, a cyclic voltammetry method is used to perform scans, so as to obtain a cyclic voltammetry curve of the electrolyte solution. Then, appropriate electrochemical polymerization conditions are selected according to the cyclic voltammetry curve, and the thin film transistors 121 are energized, so that the plurality of sub-electrodes 210 are energized, and the nanoparticles are cross-linked near the plurality of sub-electrodes 210 to form nanoparticle films on the surfaces of the plurality of sub-electrodes 210. The nanoparticle film is the light-emitting layer 22.

For example, a constant potential method may be used to energize the thin film transistors 121, so that the plurality of sub-electrodes 210 are energized.

For example, a constant current method may be used to energize the thin film transistors 121, so that the plurality of sub-electrodes 210 are energized.

For example, a pulse polarization method may be used to energize the thin film transistors 121, so that the plurality of sub-electrodes 210 are energized.

A process of using electrolysis to manufacture the light-emitting layer 22 is exemplarily described above. A specific process of manufacturing the light-emitting layer 22 will be described below by taking an example in which the light-emitting layer 22 includes first light-emitting portions capable of emitting light of a first color, second light-emitting portions capable of emitting light of a second color, and third light-emitting portions capable of emitting light of a third color.

It will be noted that, in a case where the light-emitting layer 22 includes the first light-emitting portions capable of emitting light of the first color, the second light-emitting portions capable of emitting light of the second color, and the third light-emitting portions capable of emitting light of the third color, the first electrode layer 21 includes first sub-electrodes located on sides of the first light-emitting portions proximate to the backplane 1, second sub-electrodes located on sides of the second light-emitting portions proximate to the backplane 1, and third sub-electrodes located on sides of the third light-emitting portions proximate to the backplane 1.

As shown in FIGS. 11 and 19 to 21, forming the light-emitting layer 22 includes steps 231 to 233 (S231~S233).

Figure 19:
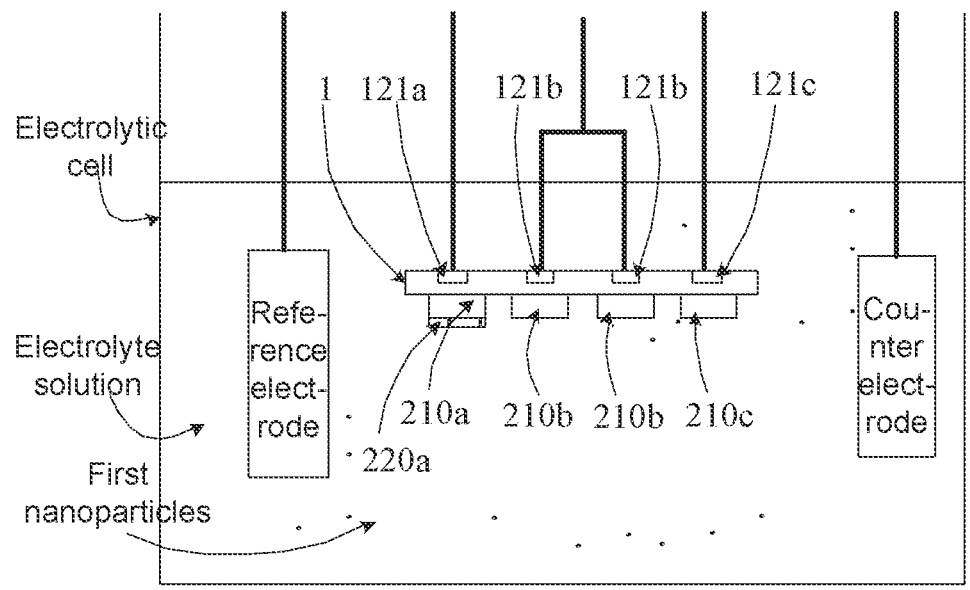

In S231, as shown in FIG. 19, the first sub-electrodes 210*a* are energized, the method of manufacturing the nanoparticle film described in the above embodiments is adopted, and a material for forming the first light-emitting portions is used, so as to form the first light-emitting portions 220*a* on sides of the first sub-electrodes 210*a* away from the backplane 1.

In S231, first, an electrolyte solution containing first nanoparticles coordinated with the first organic ligands is prepared. The first nanoparticles are used for forming the first light-emitting portions. Then, the backplane 1 on which the first electrode layer 21 has been formed is immersed in the electrolyte solution. After that, the first sub-electrodes 210*a* in the first electrode layer 21 are energized, so that electrolysis is used to cause the electrochemical reaction of the first organic ligands coordinated to the first nanoparticles, and the first nanoparticles are cross-linked to form first nanoparticle films on surfaces of the first sub-electrodes 210*a*. The first nanoparticle films are the first light-emitting portions 220*a*.

In some embodiments, the electrolyte solution containing the first nanoparticles is prepared by using the method of preparing the electrolyte solution containing the nanoparticles as described above. The three-electrode system is used to carry out the electrochemical reaction. Thin film transistors 121*a* coupled to the first sub-electrodes 210*a* are energized, and thin film transistors 121*b* coupled to the second sub-electrodes 210*b* and thin film transistors 121*c* coupled to the third sub-electrodes 210*c* are not energized. Therefore, when the first sub-electrodes 210*a* are energized, the second sub-electrodes 210*b* and the third sub-electrodes 210*c* are not energized. In this way, the first nanoparticles are cross-linked near the first sub-electrodes 210*a* to form the first nanoparticle films on the surfaces of the first sub-electrodes 210*a*. The first nanoparticle films are the first light-emitting portions 220*a*.

In some embodiments, the first nanoparticles are capable of emitting light of the first color, such as red.

Figure 20:
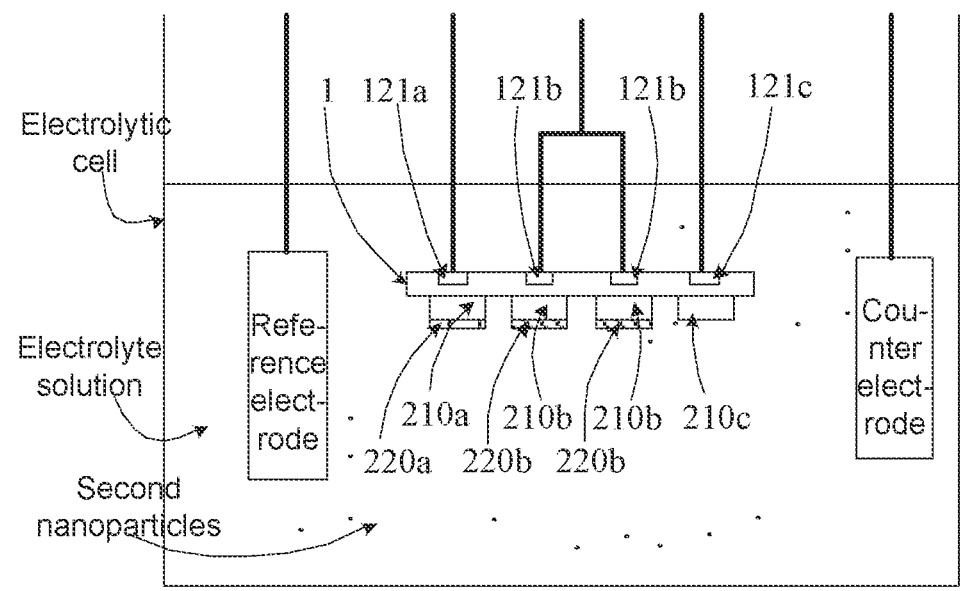

In S232, as shown in FIG. 20, the second sub-electrodes 210*b* are energized, the method of manufacturing the nanoparticle film described in the above embodiments is adopted, and a material for forming the second light-emitting portions is used, so as to form the second light-emitting portions 220*b* on sides of the second sub-electrodes 210*b* away from the backplane 1.

In S232, first, an electrolyte solution containing second nanoparticles coordinated with the first organic ligands is prepared. The second nanoparticles are used for forming the second light-emitting portions. Then, the backplane 1 on which the first electrode layer 21 has been formed is immersed in the electrolyte solution. After that, the second sub-electrodes 210*b* in the first electrode layer 21 are energized, so that electrolysis is used to cause the electrochemical reaction of the first organic ligands coordinated to the second nanoparticles, and the second nanoparticles are cross-linked to form second nanoparticle films on surfaces of the second sub-electrodes 210*b*. The second nanoparticle films are the second light-emitting portions 220*b*.

In some embodiments, the electrolyte solution containing the second nanoparticles is prepared by using the method of preparing the electrolyte solution containing the nanoparticles as described above. The three-electrode system is used to carry out the electrochemical reaction. Thin film transistors 121*b* coupled to the second sub-electrodes 210*b* are energized, and thin film transistors 121*a* coupled to the first sub-electrodes 210*a* and thin film transistors 121*c* coupled to the third sub-electrodes 210*c* are not energized. Therefore, when the second sub-electrodes 210*b* are energized, the first sub-electrodes 210*a* and the third sub-electrodes 210*c* are not energized. In this way, the second nanoparticles are cross-linked near the second sub-electrodes 210*b* to form the second nanoparticle films on the surfaces of the second sub-electrodes 210*b*. The second nanoparticle films are the second light-emitting portions 220*b*.

In some embodiments, the second nanoparticle films manufactured by using the second nanoparticles are capable of emitting light of the second color, such as green.

Figure 21:
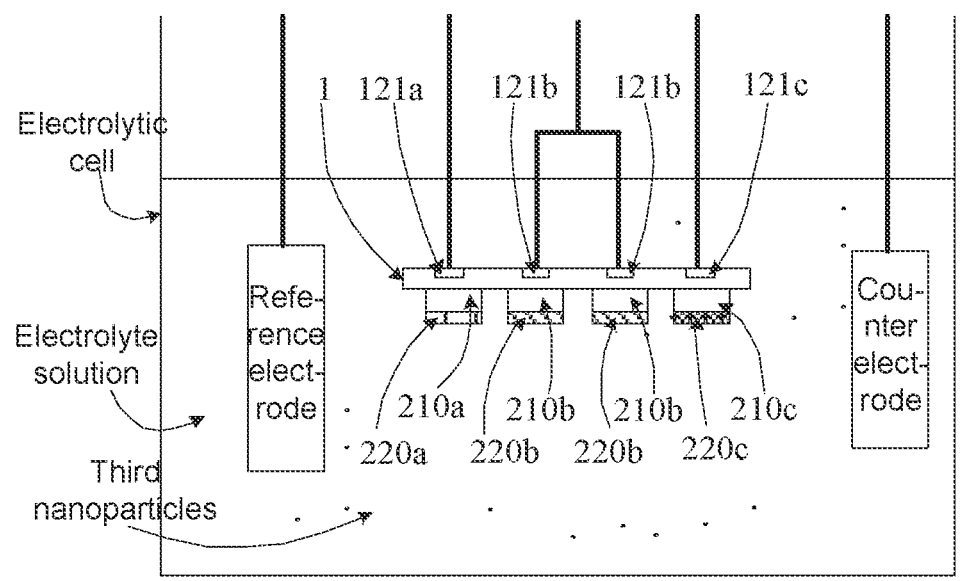

In S233, as shown in FIG. 21, the third sub-electrodes 210*c* are energized, the method of manufacturing the nanoparticle film described in the above embodiments is adopted, and a material for forming the third light-emitting portions is used, so as to form the third light-emitting portions 220*c* on sides of the third sub-electrodes 210*c* away from the backplane 1. The third light-emitting portions 121*c* that are capable of emitting light of the third color are manufactured on the third sub-electrodes 21*c*.

In S233, first, an electrolyte solution containing third nanoparticles coordinated with the first organic ligands is prepared. The third nanoparticles are used for forming the third light-emitting portions. Then, the backplane 1 on which the first electrode layer 21 has been formed is immersed in the electrolyte solution. After that, the third sub-electrodes 210*c* in the first electrode layer 21 are energized, so that electrolysis is used to cause the electrochemical reaction of the first organic ligands coordinated to the third nanoparticles, and the third nanoparticles are cross-linked to form third nanoparticle films on surfaces of the third sub-electrodes 210*c*. The third nanoparticle films are the third light-emitting portions 220*c*.

In some embodiments, the electrolyte solution containing the third nanoparticles is prepared by using the method of preparing the electrolyte solution containing the nanoparticles as described above. The three-electrode system is used to carry out the electrochemical reaction. Thin film transistors 121*c* coupled to the third sub-electrodes 210*c* are energized, and thin film transistors 121*a* coupled to the first sub-electrodes 210*a* and thin film transistors 121*b* coupled to the second sub-electrodes 210*b* are not energized. Therefore, when the third sub-electrodes 210*c* are energized, the first sub-electrodes 210a and the second sub-electrodes 210b are not energized. In this way, the third nanoparticles are cross-linked near the third sub-electrodes 210c to form the third nanoparticle films on the surfaces of the third sub-electrodes 210c. The third nanoparticle films are the third light-emitting portions 220c.

In some embodiments, the third nanoparticle films manufactured by using the third nanoparticles are capable of emitting light of the third color, such as blue.

In some embodiments, after the light-emitting layer 22 is formed on the side of the first electrode layer 21 away from the backplane 1, the display substrate 100 on which the light-emitting layer 22 has been formed may also be rinsed with chloroform, and then dried.

Figure 17:
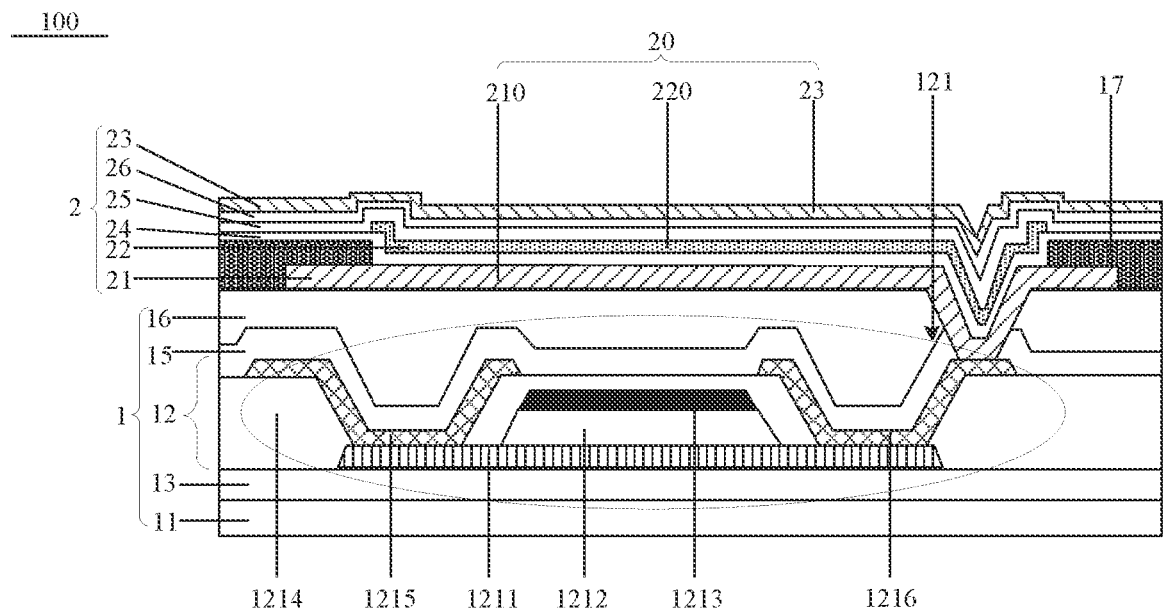

In S24, as shown in FIG. 17, a second electrode layer 23 is formed on a side of the light-emitting layer 22 away from the backplane 1.

Figure 16:
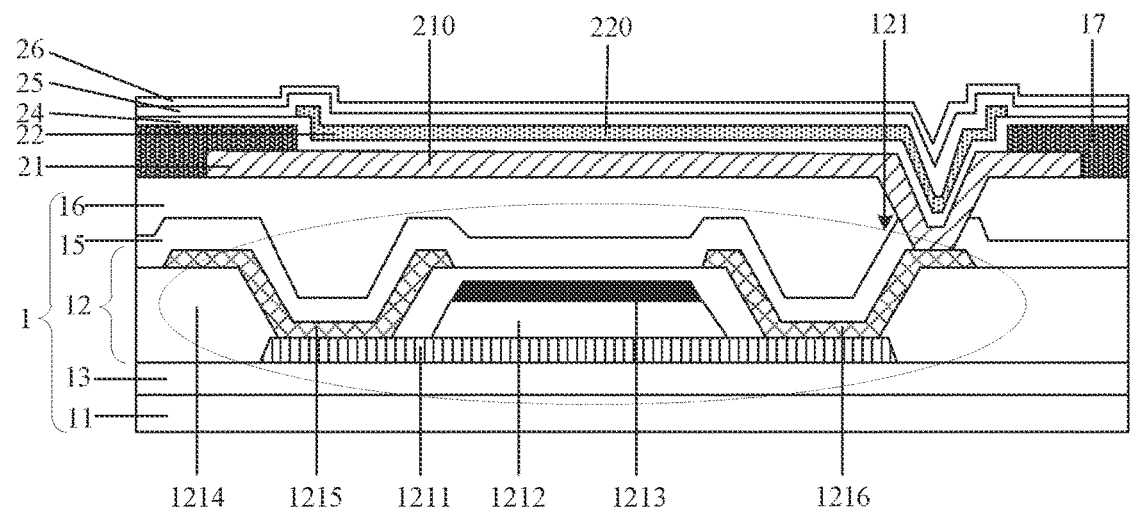

In some embodiments, as shown in FIG. 16, before the second electrode layer 23 is formed, an ETL 25 and/or an EIL 26 may also be formed on the side of the light-emitting layer 22 away from the backplane 1 by using a film forming process such as spin coating or printing. FIG. 16 shows a case where both the ETL 25 and the EIL 26 are formed.

For example, the side of the light-emitting layer 22 away from the backplane 1 is spin-coated with a zinc oxide ethanol solution (a concentration of the zinc oxide ethanol solution is 30 mg/ml, that is, 1 ml of ethanol solution contains 30 mg of zinc oxide) at 2,000 rpm for 45 s, and then dried, so as to obtain the ETL 25. Then, the EIL 26 is formed by spin coating, and the structure shown in FIG. 16 is obtained.

As shown in FIG. 17, in some embodiments, the second electrode layer 22 is formed on a side of the EIL 26 away from the backplane 1 by using a film forming process such as evaporation, CVD, or sputtering.

In the method of manufacturing the display substrate 100 provided in embodiments of the present disclosure, the light-emitting layer 22 is formed on the surface of the first electrode layer 21 of the display substrate 100 by preparing nanoparticles coordinated with the first organic ligand containing the electrochemically active group(s), and using an electrochemical reaction method. Compared with a method of forming the light-emitting layer 22 by printing, photolithography, transfer, etc., the above method of forming the light-emitting layer 22 does not require alignment. Therefore, the film formation accuracy of the light-emitting layer 22 may be improved, and a resolution of display apparatuses to which the display substrate 100 is applied may be improved.

Figure 22:
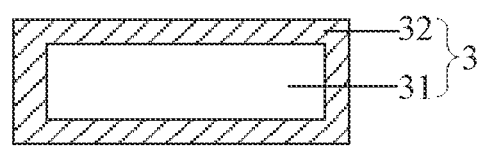
FIG. 22 is a diagram showing a structure of an electronic component, in accordance with some embodiments.

Some embodiments of the present disclosure provide an electronic component 3. Referring to FIG. 22, the electronic component 3 includes a conductive block 31 configured such that a nanoparticle film 32 is formed on a surface of the conductive block 31 by the method of manufacturing the nanoparticle film as described above, and the nanoparticle film 32 disposed on the surface of the conductive block 31.

A process of forming the nanoparticle film 32 on the surface of the conductive block 31 includes: using the conductive block 31 as the working electrode, immersing it in the electrolytic cell, and using electrolysis to make the electrochemically active groups in the first organic ligands undergo an inter-nanoparticle polymerization reaction, so that the nanoparticles coordinated with the first organic ligands are cross-linked.

Beneficial effects of the electronic component 3 provided by the above embodiments are the same as those of the method of manufacturing the nanoparticle film described above, and details are not repeated here.

The conductive block 31 may be any conductive block on which a nanoparticle film needs to be formed. In practical applications, a person skilled in the art can form a nanoparticle film 32 with a certain function on the surface of the conductive block 31 according to the needs of the electronic component 3 to realize manufacture of the electronic component 3. For example, the electronic component 3 is a composite electrode. In this case, the nanoparticles in the nanoparticle film 32 may be silver nanoparticles.

As shown in FIG. 22, in an example where the conductive block 31 is in a shape of a cube, the surface of the conductive block 31 on which the nanoparticle film is to be formed may be any one of six surfaces of the cube, or may be all the six surfaces of the cube.

It will be noted that, the shape of the conductive block 31 and the surface(s) of the conductive block 31 on which nanoparticle film(s) are to be formed are not specifically limited herein.

As shown in FIG. 22, the electronic component 3 may be a composite electrode. In this case, the conductive block 31 may be a stainless steel electrode or an indium tin oxide (ITO) electrode; the nanoparticles in the nanoparticle film 32 may be silver nanoparticles, and the nanoparticle film 32 is formed on all surfaces of the conductive block 31.

In the description of the foregoing embodiments, specific features, structures, materials, or characteristics may be combined in a suitable manner in any one or more embodiments or examples. The foregoing descriptions are merely specific implementations of the present disclosure, but the protection scope of the present disclosure is not limited thereto. Any person skilled in the art could readily conceive of changes or replacements within the technical scope of the present disclosure, which shall all be included in the protection scope of the present disclosure. Therefore, the protection scope of the present disclosure shall be subject to the protection scope of the claims.

What is claimed is:

1. A display substrate, comprising:
a backplane;
a first electrode layer disposed on a side of the backplane; and
a light-emitting layer disposed on a side of the first electrode layer away from the backplane, wherein the light-emitting layer includes nanoparticles and a product that is obtained by an electrochemical reaction of electrochemically active groups contained in first organic ligands coordinated to the nanoparticles, and the nanoparticles are cross-linked together through the product.

2. The display substrate according to claim 1, wherein the first organic ligands include at least one of a thiophene derivative, a pyrrole derivative, a furan derivative, an aniline derivative, and a diphenyl ether derivative.

3. The display substrate according to claim 1, wherein the light-emitting layer includes first light-emitting portions capable of emitting light of a first color, second light-emitting portions capable of emitting light of a second color, and third light-emitting portions capable of emitting light of a third color; and the first color, the second color and the third color are three primary colors;
the first electrode layer includes first sub-electrodes located on sides of the first light-emitting portions proximate to the backplane, second sub-electrodes located on sides of the second light-emitting portions proximate to the backplane, and third sub-electrodes located on sides of the third light-emitting portions proximate to the backplane.

4. The display substrate according to claim 1, wherein the nanoparticles are quantum dots.

5. The display substrate according to claim 1, further comprising:
 a second electrode layer disposed on a side of the light-emitting layer away from the backplane;
 a hole injection layer and/or a hole transport layer disposed between the first electrode layer and the light-emitting layer; and
 an electron injection layer and/or an electron transport layer disposed between the second electrode layer and the light-emitting layer.

6. A method of manufacturing a display substrate, the method comprising:
 manufacturing a backplane;
 forming a first electrode layer on a side of the backplane; and
 forming a light-emitting layer on a side of the first electrode layer away from the backplane, wherein the light-emitting layer includes nanoparticles and a product that is obtained by an electrochemical reaction of electrochemically active groups contained in first organic ligands coordinated to the nanoparticles, and the nanoparticles are cross-linked together through the product.

7. The method according to claim 6, wherein forming the light-emitting layer on the side of the first electrode layer away from the backplane, includes:
 preparing the nanoparticles coordinated with the first organic ligands, the first organic ligands containing the electrochemically active groups capable of undergoing the electrochemical reaction; and
 energizing the first electrode layer to cause the electrochemical reaction of the first organic ligands coordinated to the nanoparticles, so that the nanoparticles are cross-linked to form a nanoparticle film on a surface of the first electrode layer, the nanoparticle film being the light-emitting layer.

8. The method according to claim 7, wherein preparing the nanoparticles coordinated with the first organic ligands, includes:
 obtaining the nanoparticles coordinated with the first organic ligands through a coordination reaction between the nanoparticles and the first organic ligands; or
 obtaining the nanoparticles coordinated with the first organic ligands through a ligand exchange reaction between nanoparticles coordinated with second organic ligands and the first organic ligands.

9. The method according to claim 7, wherein preparing the nanoparticles coordinated with the first organic ligands, further includes: preparing the first organic ligands, wherein preparing the first organic ligands, includes:
 providing an organic material having the electrochemically active groups; and
 using a coordination group as a substituent to substitute for at least one hydrogen atom in the organic material to obtain the first organic ligands.

10. The method according to claim 9, wherein the organic material having the electrochemically active groups includes at least one of thiophene, pyrrole, furan, aniline, and diphenyl ether.

11. The method according to claim 8, wherein the nanoparticles coordinated with the first organic ligands are obtained through the ligand exchange reaction between the nanoparticles coordinated with the second organic ligands and the first organic ligands,
 the second organic ligands include at least one of oleic acid, oleylamine, dodecyl mercaptan, octyl mercaptan, trioctyl phosphine, trioctyl phosphine oxide, and ethanolamine.

12. The method according to claim 7, wherein energizing the first electrode layer to cause the electrochemical reaction of the first organic ligands coordinated to the nanoparticles, so that the nanoparticles are cross-linked to form the nanoparticle film on the surface of the first electrode layer, the nanoparticle film being the light-emitting layer, includes:
 preparing an electrolyte solution containing the nanoparticles coordinated with the first organic ligands;
 immersing the backplane on which the first electrode layer has been formed in the electrolyte solution; and
 energizing the first electrode layer, so that electrolysis is used to cause the electrochemical reaction of the first organic ligands coordinated to the nanoparticles, and the nanoparticles are cross-linked to form the nanoparticle film on the surface of the first electrode layer, the nanoparticle film being the light-emitting layer.

13. The method according to claim 6, wherein the light-emitting layer includes first light-emitting portions capable of emitting light of a first color, second light-emitting portions capable of emitting light of a second color and third light-emitting portions capable of emitting light of a third color, and the first electrode layer includes first sub-electrodes located on sides of the first light-emitting portions proximate to the backplane, second sub-electrodes located on sides of the second light-emitting portions proximate to the backplane and third sub-electrodes located on sides of the third light-emitting portions proximate to the backplane,
 forming the light-emitting layer, includes:
 preparing an electrolyte solution containing first nanoparticles coordinated with the first organic ligands, the first nanoparticles being used for forming the first light-emitting portions; immersing the backplane on which the first electrode layer has been formed in the electrolyte solution; and energizing the first sub-electrodes in the first electrode layer, so that electrolysis is used to cause the electrochemical reaction of the first organic ligands coordinated to the first nanoparticles, and the first nanoparticles are cross-linked to form first nanoparticle films on surfaces of the first sub-electrodes, the first nanoparticle films being the first light-emitting portions;
 preparing an electrolyte solution containing second nanoparticles coordinated with the first organic ligands, the second nanoparticles being used for forming the second light-emitting portions; immersing the backplane on which the first electrode layer has been formed in the electrolyte solution; and energizing the second sub-electrodes in the first electrode layer, so that electrolysis is used to cause the electrochemical reaction of the first organic ligands coordinated to the second nanoparticles, and the second nanoparticles are cross-linked to form second nanoparticle films on surfaces of the second sub-electrodes, the second nanoparticle films being the second light-emitting portions; and
 preparing an electrolyte solution containing third nanoparticles coordinated with the first organic ligands, the third nanoparticles being used for forming the third light-emitting portions; immersing the backplane on which the first electrode layer has been formed in the electrolyte solution; and energizing the third sub-electrodes in the first electrode layer, so that electrolysis is used to cause the electrochemical reaction of the first organic ligands coordinated to the third nanoparticles, and the third nanoparticles are cross-linked to form third nanoparticle films on surfaces of the third sub-electrodes, the third nanoparticle films being the third light-emitting portions.

14. The method according to claim 12, wherein the electrochemical reaction is realized by any one of a cyclic voltammetry method, a constant potential method, a constant current method and a pulse polarization method.

15. The method according to claim 6, further comprising:
   forming a second electrode layer on a side of the light-emitting layer away from the backplane.

16. A display apparatus, comprising:
   the display substrate according to claim 1; and
   an encapsulation structure disposed on the display substrate.

* * * * *